United States Patent [19]
Shigehara et al.

[11] Patent Number: 5,892,387
[45] Date of Patent: Apr. 6, 1999

[54] ANALOG SWITCHING CIRCUIT DEVICE AND SEMICONDUCTOR INTEGRATED CIRCUIT DEVICE

[75] Inventors: Hiroshi Shigehara, Oita; Masanori Kinugasa, Yokohama, both of Japan

[73] Assignee: Kabushiki Kaisha Toshiba, Kawasaki, Japan

[21] Appl. No.: 893,154

[22] Filed: Jul. 15, 1997

[30] Foreign Application Priority Data

Jul. 24, 1996 [JP] Japan ................................. 8-194459

[51] Int. Cl.⁶ .............................................. H03K 19/0175
[52] U.S. Cl. ........................ 327/537; 327/544; 327/419; 327/434
[58] Field of Search ................................. 327/534, 535, 327/537, 544, 403, 404, 419, 434, 436, 437

[56] References Cited

U.S. PATENT DOCUMENTS

| | | | |
|---|---|---|---|
| 3,866,064 | 2/1975 | Gregory et al. | 327/437 |
| 4,611,135 | 9/1986 | Nakayama et al. | 327/391 |
| 5,317,532 | 5/1994 | Ochii | 365/149 |
| 5,442,307 | 8/1995 | Shigehara et al. | 326/81 |

*Primary Examiner*—Timothy P. Callahan
*Assistant Examiner*—An T. Luu
*Attorney, Agent, or Firm*—Foley & Lardner

[57] ABSTRACT

In a situation where another analog switching circuit 502 outputs a high potential Vh, this high potential Vh is applied to an output terminal OUT1 of an analog switching circuit 504. When a ground potential is supplied to a node 10 with a changeover switch SW, a diode DD1 falls to an inversely biased state, whereby a potential at a backgate node Nw comes to be approximately equal to the potential Vh. Moreover, a potential approximately equal to the potential Vh is a power source terminal of an NAND gate NAND1, and it is transmitted to an output terminal VGP through an internal circuit, whereby a P channel MOS transistor P1 is turned off. Moreover, the output VGP from an inverter INV5 makes also an N channel MOS transistor N1 turn off. With such a constitution, an unnecessary current is prevented from flowing from a power source potential terminal on a bus line and so on to a ground potential terminal through a parasitic diode, thereby performing full-swinging without lowering an output level.

20 Claims, 17 Drawing Sheets

$\overline{EN}$ = Vcc : P1 turns on
  = GND : P1 turns off

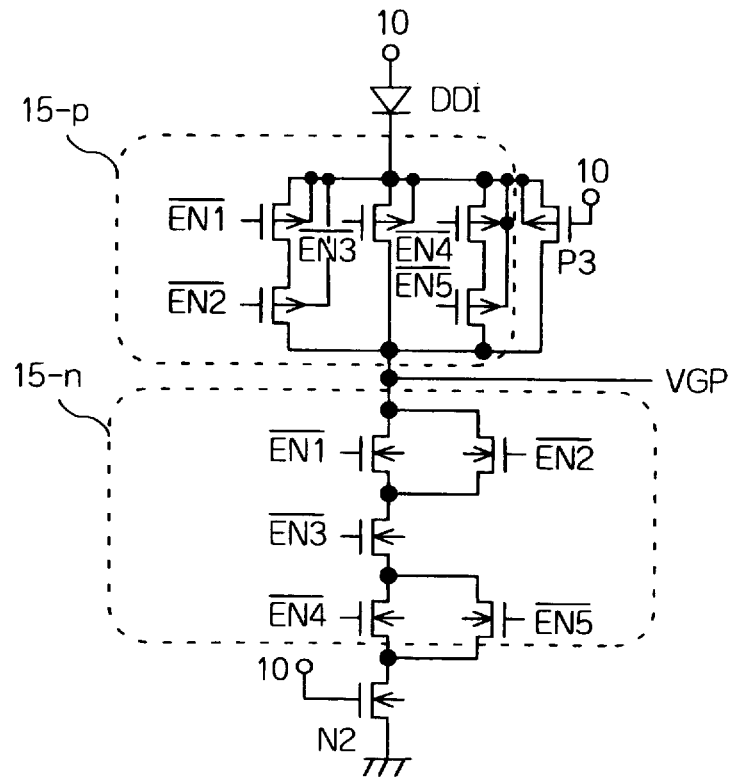
F I G. 6A
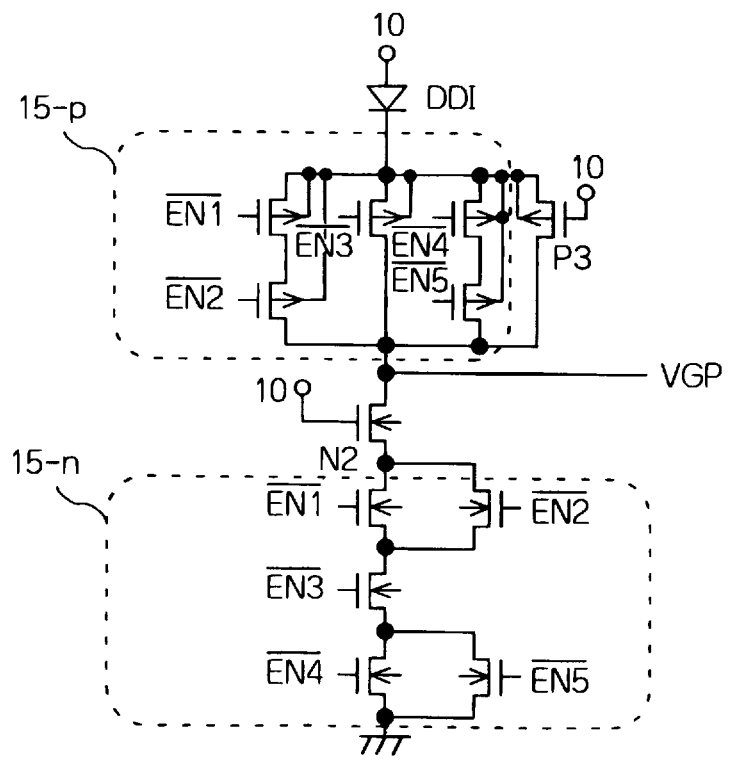
F I G. 6B

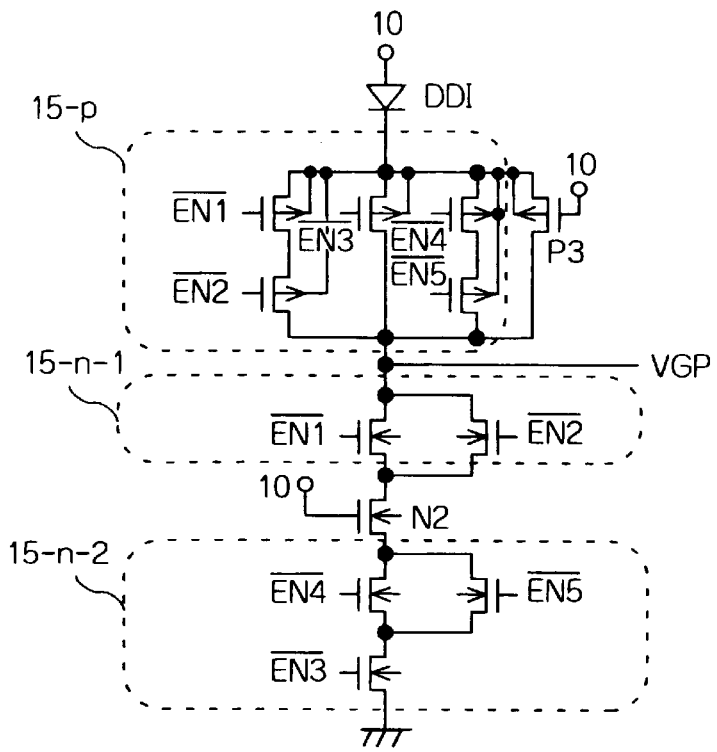
F I G. 7
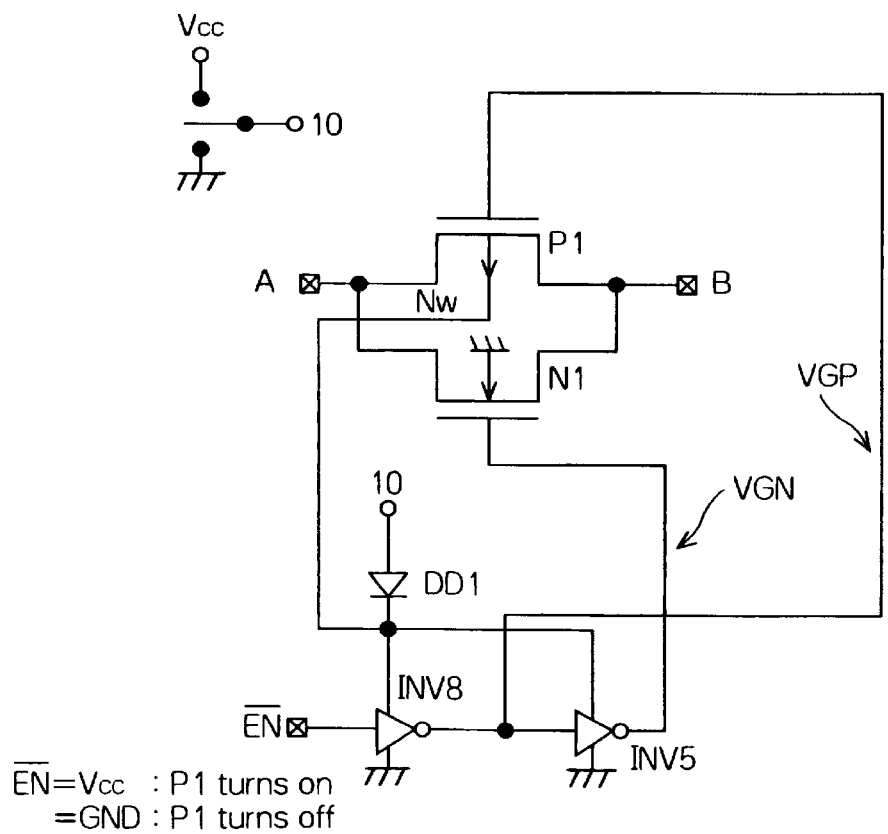
F I G. 8

$\overline{EN}$=Vcc : P1 turns on
    =GND : P1 turns off

EN=GND : P1 turns on
  =VCC : P1 turns off

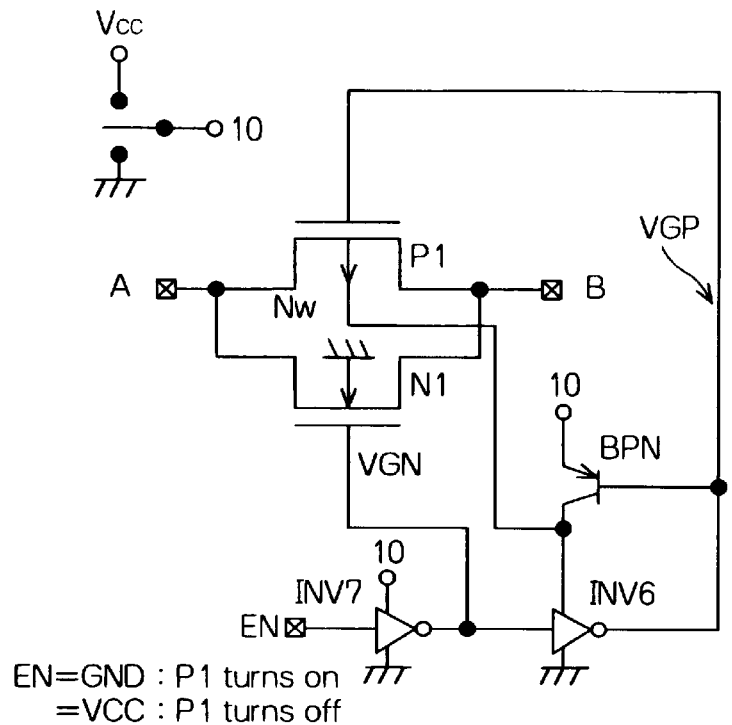
F I G. 20
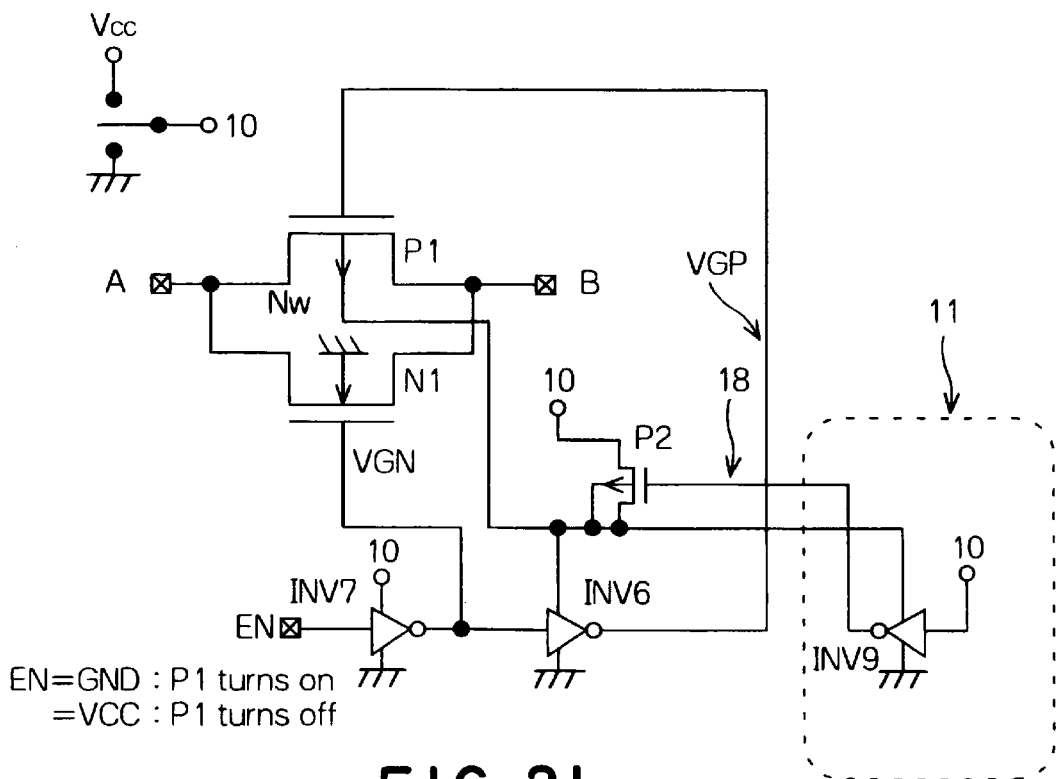
F I G. 21

ANALOG SWITCHING CIRCUIT DEVICE AND SEMICONDUCTOR INTEGRATED CIRCUIT DEVICE

BACKGROUND OF THE INVENTION

The present invention relates to an analog switching circuit device for use in a semiconductor integrated circuit.

An analog switching circuit is one that transmits an analog signal in one direction or in two directions by switching. In general, various kinds of electronic equipment such as computers and controlling devices comprise a plurality of circuit boards therein, each circuit board being connected to a common bus line. For example, an analog switching circuit is provided in each circuit board and the circuit board is connected to the common bus line through the analog switching circuit, whereby signals are transferred between the circuit boards.

For the analog switching circuit, in the bus line application using a plurality of analog switching circuits connacted each other through the bus line, in the case where a power source potential of at least one of the analog switching circuit is set to a ground potential and this analog switching circuit is in a non-operative state, when other analog switching circuits outputs a potential higher than the ground potential, a drawback that a current flows through the parasitic diode of the analog switching circuit, which is in the non-operation state, is produced.

Furthermore, where the analog switching circuit is designed so that such a current does not flow therethrough, the output level onto the bus line reduces and the circuit does not perform full-swing.

SUMMARY OF THE INVENTION

Therefore, the present invention was made from viewpoint of the above described problems. The object of the present invention is to provide an analog switching circuit device comprising a plurality of analog switching circuits, each of which is used by connecting its output terminal to a bus line or by connecting its output terminal to a terminal end resistor, wherein no unnecessary current flows through a parasitic diode from a power source on the bus line to a ground even when at least one analog switching circuit is set to a non-operation state by connecting it to the ground.

Another object of the present invention is to provide an analog switching circuit device which is capable of reducing an ON resistance all over ranges of used voltages to perform a full-swing without reducing an output level, while preventing unnecessary current from occurring.

In accordance with the present invention, an analog switching circuit comprises:

a switching section including a first MOS transistor having a source, a drain, a gate and a backgate; and a control section for providing an input signal supplied from one terminal of the switching section to the other terminal by on/off control, wherein the control section includes a diode, one terminal of which is connected to the backgate of the first MOS transistor;

a changeover switch connected to the other terminal of the diode for switching a connection of the other terminal of the diode to either a power source potential or a ground potential; and a control circuit connected to a connection node of the diode and the backgate of the first MOS transistor for receiving a control signal and for supplying a potential at the connection node to the gate of the first MOS transistor in accordance with a connection state of the changeover switch with the power source potential or the ground potential.

Furthermore, the control circuit performs a control operation by supplying a potential in accordance with the control signal to the gate of the first MOS transistor when the changeover switch selects the power source potential, and the control circuit causes the first MOS transistor to turn off by supplying a backgate potential of the first MOS transistor to the gate thereof when the changeover switch selects the ground potential.

Furthermore, the switching section is a CMOS analog switch composed of the first MOS transistor and a MOS transistor having an opposite channel type to that of the first MOS transistor, the first MOS transistor being coupled in parallel to the MOS transistor.

According to the present invention, in an application driven by more than one power source, when a power source for at least one analog switching circuit is made to be in a non-operation state by setting the power source to the ground potential, unnecessary current can be prevented from flowing from the power source potential for other analog switching circuits and the bus line to the ground potential through the parasitic diode. Furthermore, even when the power source potential is supplied to the analog switching circuit, as the signal can be transmitted with full-swing, a problem of a flowing-through current due to an intermediate potential input is not caused in a circuit to receive the signal, thereby reducing a lower power consumption. Moreover, a threshold value of the circuit to receive the signal may be a level of a CMOS transistor, thereby increasing the resistance to noises.

BRIEF DESCRIPTION OF THE DRAWINGS

For more complete understanding of the present invention and the advantages thereof, reference is now made to the following description taken in conjunction with the accompanying drawings, in which;

FIG. 6A and 6B are a circuit constitution example exemplifying a logic circuit 15 of FIG. 5;

FIG. 7 is another circuit constitution example exemplifying a logic circuit 15 of FIG. 5;

FIG. 8 is a circuit diagram of a fourth embodiment of an analog switching circuit device according to the present invention;

FIG. 20 is a circuit diagram relating to a base connection of a pnp bipolar transistor BPN forming the diode DD1;

FIG. 21 is a circuit diagram of a ninth embodiment of an analog switching circuit device according to the present invention;

DETAILED DESCRIPTION OF THE PREFERRED EMBODIMENTS

For more apparently understanding the features and advantages of the present invention, the earlier technology which is related to the present invention will briefly described below, with reference to FIGS. 24 to 26.

Figure 24:
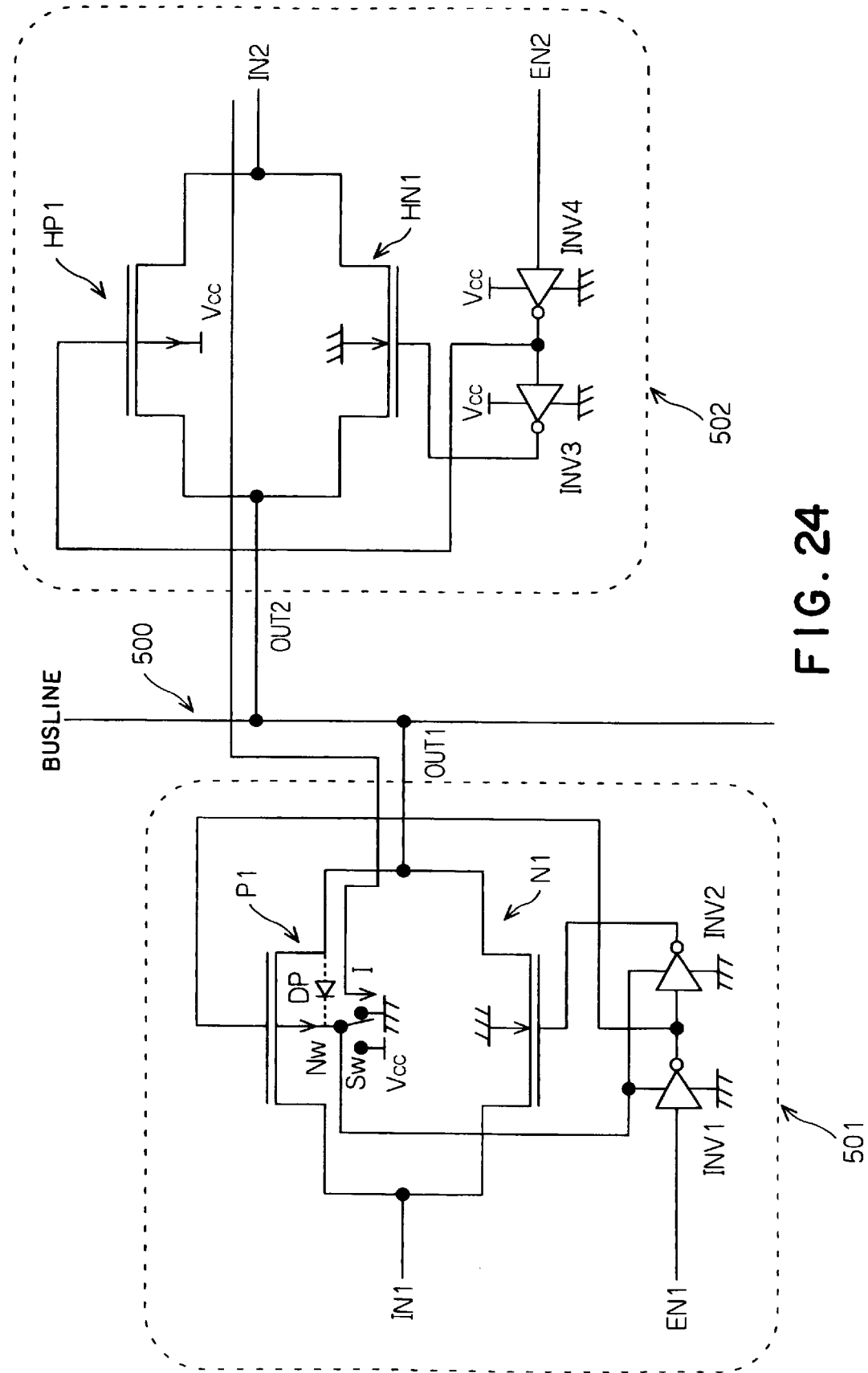
FIG. 24 is a circuit constitution diagram showing a bus line application in which a plurality of analog switching circuits are connected to the bus line.

FIG. 24 shows a circuit diagram illustrating an application example of a bus line to which a circuit board is connected through two analog switching circuits. It should be noted that specified circuits and devices (not shown) are connected to each of the analog switching circuits.

Referring to FIG. 24, two analog switching circuits 501 and 502 are connected to a bus line 500, through which a signal is input/output. Both the analog switching circuits 501 and 502 has a CMOS constitution. When these analog switching circuits perform a complementary switching operation, they have a feature in that an ON resistance can be reduced all over voltages where they are operated. Here, in case where the analog switching circuits 501 and 502 are, in their operation states, enabled, e. g. they are in ON state, respectively, with enable signals IN1 and IN2 serving as a control signal, the circuits 501 and 502 provide signals in accordance with the enable signals IN1 and IN2, respectively. On the other hand, in case where the analog switching circuits 501 and 502 are disenabled (non-operative state), e.g. they are in OFF state, with the enable signals IN1 and IN2, an output terminal of them are set to be a high impedance state.

Here, while a power source potential Vcc is being supplied to the analog switching circuit 502, a power source terminal of the other analog switching circuit 501 is alternatively supplied with the power source potential Vcc and a ground potential by a changeover switch SW. When the analog switching circuit 501 is made to be an operation state, the changeover switch SW is connected to the power source potential Vcc. When the switching circuit 501 is made to be a non-operation state, the changeover switch SW is switched to the ground potential. FIG. 24 shows a situation where the ground potential is selectively connected to the analog switching circuit 501 by the changeover switch SW.

Here, the CMOS structure such as the analog switching circuit 501 involves a variety of pn junctions parasitically existing therein. FIG. 25 exemplifies a section view of a semiconductor device for explaining the existence of a parasitic diode.

In the semiconductor device, a p-type well 102 and n-type well 103 are formed, for example, in a p-type semiconductor substrate 101. In the p-type well, an N channel MOS transistor N1 is formed of an N⁻-type regions 104 and 105 and a gate 106. Furthermore, a p⁻-type region 107 is formed as a backgate, which is connected to a ground potential GND. Similarly, in the n-type well 103, a P channel MOS transistor P1 is formed of p⁻-type regions 108 and 109 and a gate 110. Furthermore, an n⁻ region 111 is formed as a backgate and a node Nw is connected to a changeover switch SW.

Figure 25:
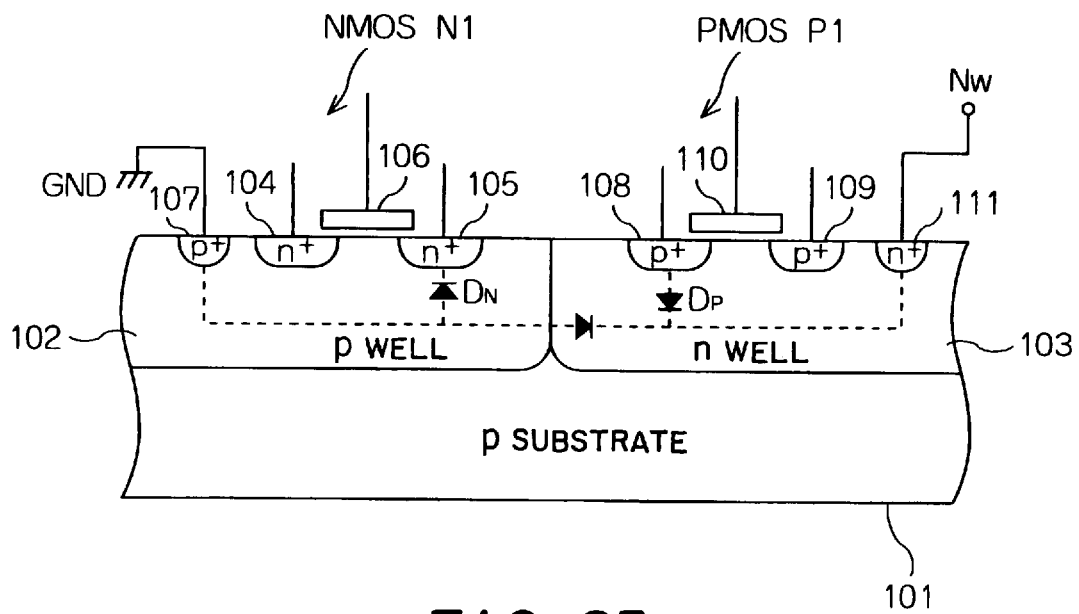
FIG. 25 is a section view of a semiconductor wafer for explaining a existence of a parasitic diode.

Among the pn junctions, a parasitic diode DP is formed between the p-type source/drain diffusion layer and the n-type backgate of the P-channel MOS transistor, as shown in FIG. 25. This parasitic diode DP, having a polarity shown in FIG. 24, will be arranged between an output node OUT1 and a power source connected to the backgate of the P channel MOS transistor P1.

It is now assumed that the switch SW connected to a power source terminal of the analog switching circuit 501 contacts selectively with the ground potential as shown in FIG. 24. In such situation, the analog switching circuit 502 is set to be an enable state by an enable signal EN2. For example, when a potential of a level equal to the power source Vcc is applied to an input terminal IN2, an output OUT2 approximately equal to the power source potential Vcc is output onto the bus line 500. Here, in the analog switching circuit 501, assuming that a built-in potential of the parasitic pn junction between the drain diffusion layer and backgate of the MOS transistor P1 is assumed to be Vf, when the relation of Vf<Vcc holds as the result of the comparison of the built-in potential Vf with the power source potential Vcc, the parasitic diode DP is set to be a forwardly biased state. Therefore, a current I comes to flow through a path formed on the bus line 500, which extends from the power source Vcc to the ground through the parasitic diode DP and the changeover switch SW.

Such situation is also produced when the bus line 500 is pulled-up to the potential Vcc with resistance element and the like. Specifically, as a case where the bus line 500 is pulled-up, there is one where the analog switching circuit 501 is connected to the bus line 500 through the resistance element. In such situation, when the changeover switch SW of the analog switching circuit 501 is connected to the ground potential, the current I flows from the input terminal IN1 and the power source Vcc on the bus line 500 through the resistance element, the diode DP and the changeover switch SW.

In order to prevent such flow of the current I, it is considered to constitute the MOS transistor of the analog switching circuit 501 connected to the bus line 500 with a single N channel MOS transistor.

Figure 26:
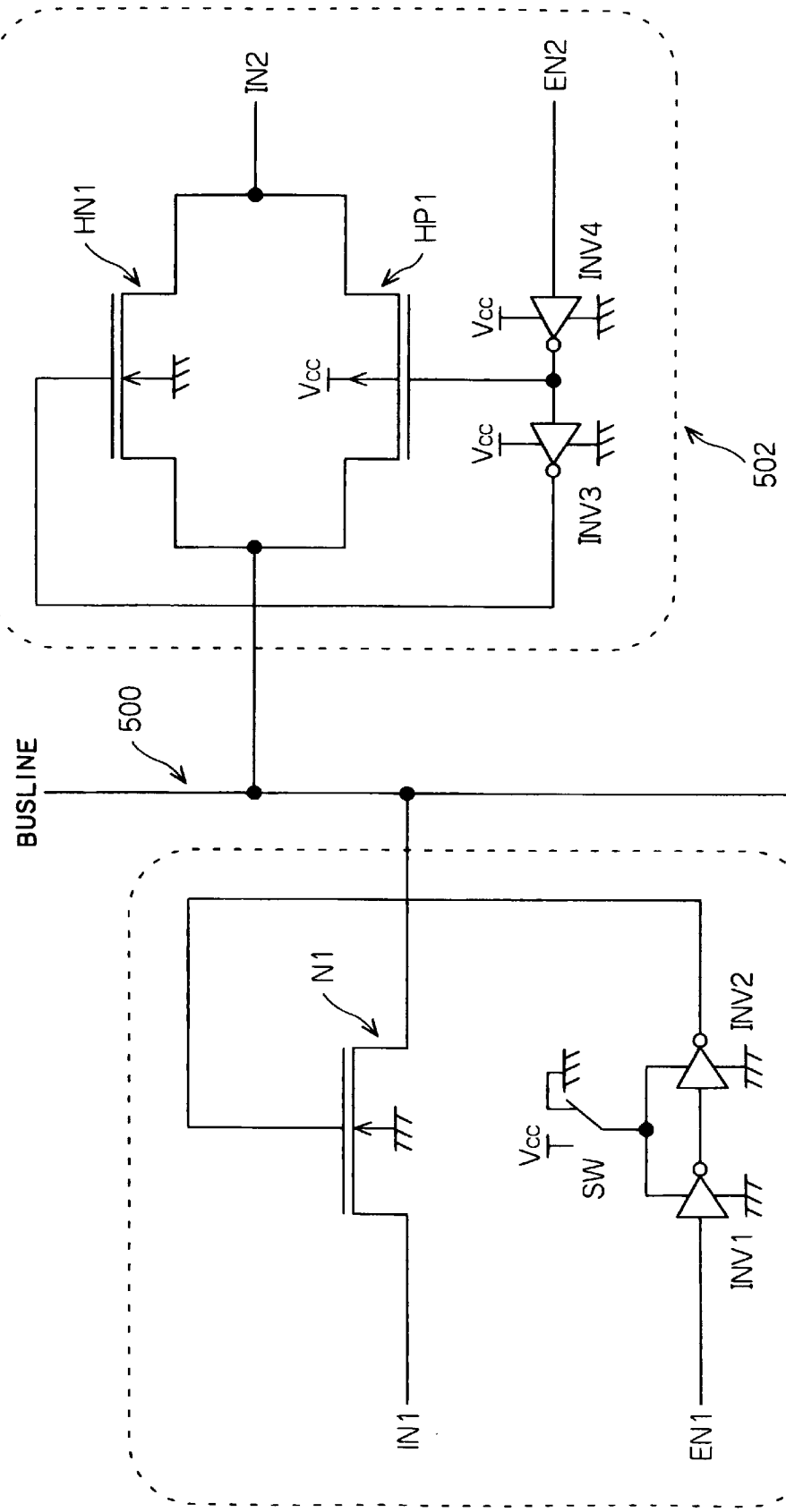
FIG. 26 is a circuit diagram of a conventional bus line application using analog switching circuits composed of only N channel MOS transistors.

FIG. 26 shows a circuit diagram of a bus line application using an analog switching circuit, which consists of a single N channel MOS transistor.

In FIG. 26, the analog switching circuit 502 and the bus line 500 have the same constitutions as those of FIG. 24. However, a switching section of the analog switching circuit 503 consists of only an N channel MOS transistor N1. In the analog switching circuit 503, a gate signal is generated by inverters INV1 and INV2. The inverter INV1 receives an enable signal EN1 as an input signal and the inverter INV2 receives an output signal from the inverter INV1 as an input signal.

However, as shown in FIG. 26, in the case where the analog switching circuit is constituted of only the N channel MOS transistor N1, though the ground potential can be output onto the bus line 500, the power source potential Vcc can not be directly output onto the bus line 500. Specifically, a signal level of the output onto the bus line 500 will be reduced by an amount equal to the threshold value of the N channel MOS transistor N1. Furthermore, as the output voltage increases, the resistance increases. The resistance finally increases to infinite quality. Therefore, the signal voltage to be used is limited to a certain range, resulting in response delay in the large resistance region.

As described above, for the analog switching circuit, in the bus line application using a plurality of analog switching circuits connected each other through the bus line, in the case where a power source potential of at least one of the analog switching circuit, for example, the analog switching circuit 501, is set to a ground potential and this analog switching circuit is in a non-operative state, when other analog switching circuits, for example, the analog switching circuit 502, outputs a potential higher than the ground potential, a drawback that a current flows through the parasitic diode of the analog switching circuit, which is in the non-operation state, is produced.

Furthermore, when the analog switching circuit is designed such that no current flows therethrough like the analog switching circuit 503, the output onto the bus line 500 reduces, so that the circuit will not perform full-swing.

Comparing with the earlier technology aforementioned, embodiments of the present invention will be described in detail with reference to the accompanying drawings below.

Figure 1:
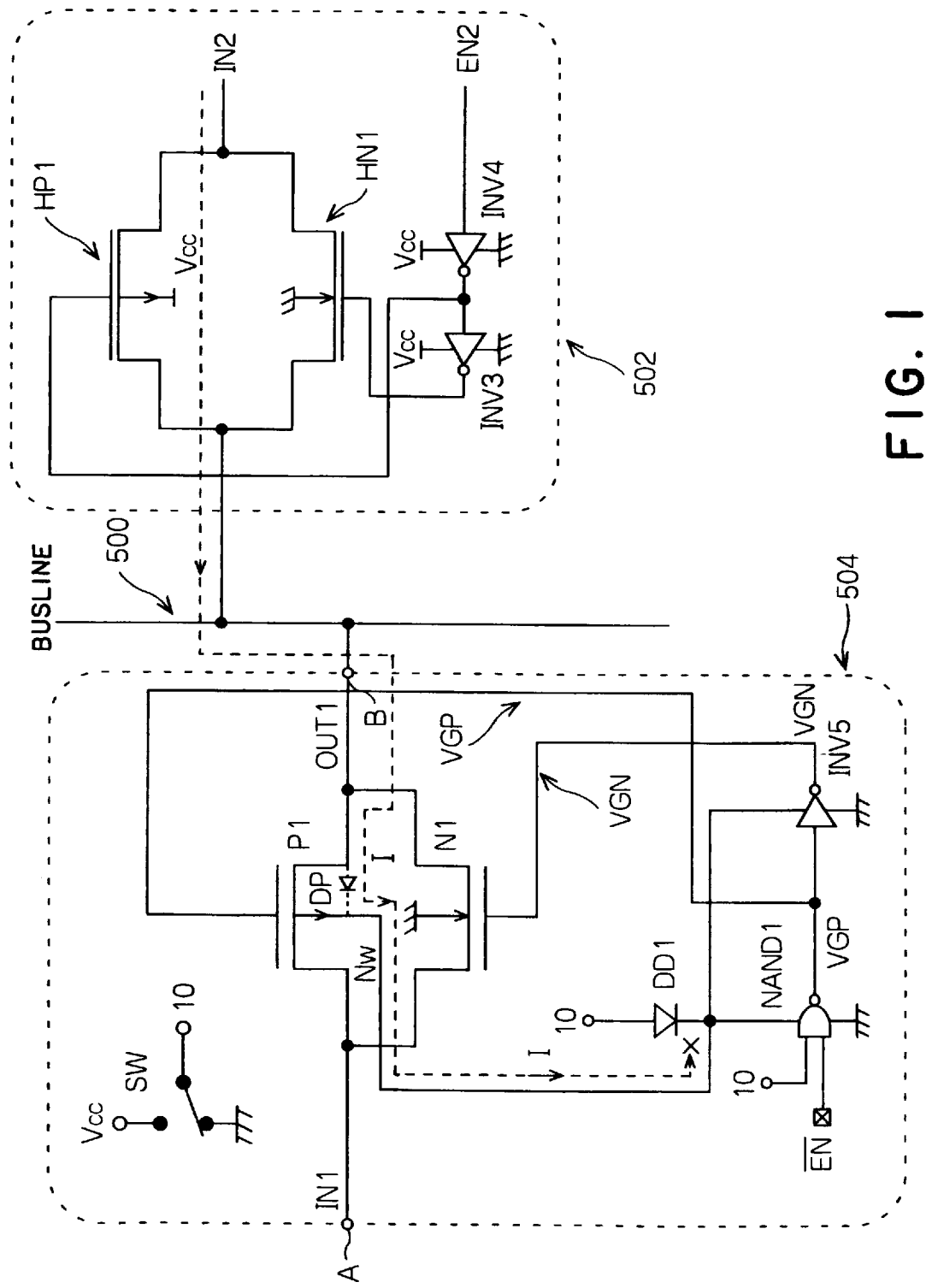
FIG. 1 is a circuit diagram of a first embodiment of an analog switching circuit device according to the present invention.

A circuit diagram of a first embodiment of an analog switching circuit device according to the present invention is shown in FIG. 1. The analog switching circuit device comprises analog switching circuits 502 and 504, each of which is properly connected to predetermined circuits and equipment. The analog switching circuits receive a signal from a terminal A or a terminal B and output it onto the terminal B or the terminal A respectively by an ON/OFF control.

In the analog switching circuit 504, a switching section is principally constituted of P channel and N channel MOS transistors P1 and N1. The sources and drains of the P and N channel MOS transistors are in parallel and are connected in common, the connection nodes of which serve as an input terminal IN1 and an output terminal OUT1. An NAND gate for generating a control signal to drive the gates of both MOS transistors P1 and N1 is composed of a NAND gate NAND1, an inverter INV5, and a diode DD1. A node 10 is connected to either a power source Vcc or a ground with a changeover switch SW. When the changeover switch SW is switched to the power source Vcc, the analog switching circuit 504 is made to be an operation state. On the other hand, when the changeover switch SW is switched to the ground, the analog switching circuit 504 is made to be a non-operation state. For example, in a situation where a power source of circuits and equipments connected to the terminal A of the analog switching circuit 504 is in ON state, when these circuit boards are connected to the bus line 500, the analog switching circuit 504 can be made to be the non-operation state by operating the changeover switch SW.

Either the power source potential Vcc or the ground potential is applied to one terminal of the NAND gate NAND1 through the changeover switch SW, and an enable signal /EN (hereinafter, symbol "/" denotes an inverted signal) is applied to the other terminal thereof. The switching section has a CMOS structure. When, at the time of the operation state of the switching section, an enable signal /EN that is a control signal is made to be an active state, for example, a high level Vcc, a signal in accordance with the input signals IN1 and IN2 is output onto the bus line 500. On the other hand, when the enable signal /EN is made to be an inactive state that is not active state, for example, a low level GND, an output is made to be a high impedance state.

Concretely describing the constitution of the semiconductor device, the N channel MOS transistor N1 is formed on a P type semiconductor substrate, and the P channel MOS transistor P1 is formed on an N type semiconductor substrate. In this semiconductor device, an N well is formed on the P type semiconductor substrate, and the N and P channel MOS transistors shall be formed on these semiconductor substrates and the well. Here, thereafter, a backgate (P type semiconductor substrate) of the N channel MOS transistor such as an NAND gate and a inverter (not shown) shall be fixed to a ground potential.

As described above, in the case where a node 10 is connected to the ground potential, there is a possibility that a higher potential than the ground potential might be applied to the output OUT1, for example, from the bus line 500. For example, as shown in FIG. 1, a P type diffusion layer serving as the drain of the P channel MOS transistor has been formed in the N type substrate (N well), whereby a parasitic pn junction diode DP is to be formed between the drain of the P channel MOS transistor and the N well (N type substrate). Therefore, in the earlier technology, in the case where the node 10 is switched to the ground potential, if the higher potential than the ground potential is applied to the output terminal OUT1, the parasitic pn junction diode DP is forwardly biased, and an unnecessary current flows, accordingly, the N type substrate which is biased up to the power source potential Vcc can not be used. However, in FIG. 1, the P channel MOS transistor in the NAND gate NAND1 and the P channel MOS transistor in the inverter INV5 are connected to the backgate node Nw of the P channel MOS transistor P1 and are further connected to the power source or the ground through the diode DD1 and the changeover switch SW. It should be noted that all of the foregoing P channel MOS transistors need not be formed in the same N well and they may be formed in different N wells electrically connected. Detail descriptions for the NAND gate and the inverter will be made below.

FIG. 2 exemplifies the circuit constitution of the NAND gate.

Figure 2A:
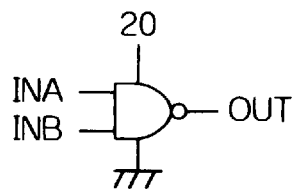
FIG. 2A, 2B and 2C are circuit constitution diagrams of a NAND gate.
Figure 2B:
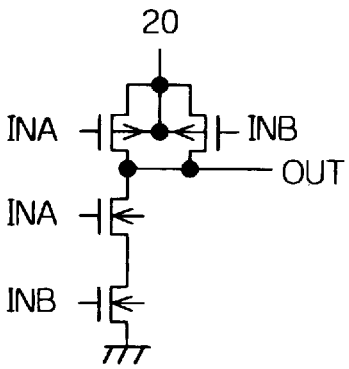
Figure 2C:
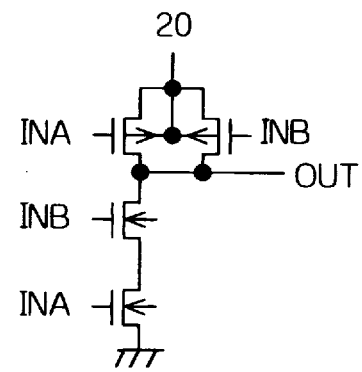

The NAND gate NAND1 has one input terminal connected to the enable signal /EN and the other input terminal connected to the node 10. The NAND gate NAND1 is denoted by the symbol used in FIG. 2A and is constituted by the circuits, for example, in FIGS. 2B and 2C. A node 20 in FIG. 2A is connected to the node 10 through the diode DD1.

Figure 3A:
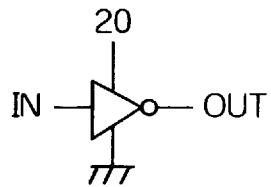
FIG. 3A and 3B are circuit constitution diagrams of an inverter.
Figure 3B:
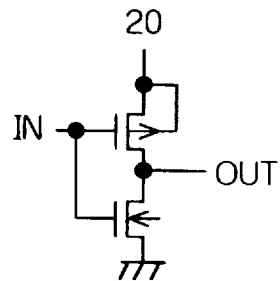

FIGS. 3A and 3B exemplify a circuit constitution of the inverter.

An output terminal of the inverter INV5 is connected to the gate of the N channel MOS transistor N1. The inverter INV5 is denoted by the symbol used in FIG. 3A, and the inverter is constituted by the circuit of, for example, FIG. 3B. The node 20 in FIG. 3B is connected to a common connection node of the NAND gate NAND1 and the diode DD1. This common connection node is further connected to the backgate node Nw of the P channel MOS transistor P1. An output terminal VGP of the NAND gate NAND1 is supplied to the gate of the P channel MOS transistor P1 and further is supplied to the inverter INV5 as an input signal thereto.

Next, an operation of the analog switching circuit device of the present invention will be described below. It should be noted that threshold voltages of the P channel MOS transistors PX (X: 1, 2,...) shall be represented in terms of Vtp (PX). The threshold voltages of the P channel MOS transistors shall be represented in terms of Vtp when the P channel MOS transistors are not discriminated from each other.

First, description will be made for an operation of the analog switching circuit at the time when the power source potential Vcc is applied to the node 10, specifically when the analog switching circuit is in an operation state. Since the node 10 of the NAND gate NAND1, which is one terminal for receiving an input signal, is set to be a level of the power source potential Vcc through the changeover switch SW, an inverted signal EN which is obtained by inverting the input signal /EN is output on the output terminal VGP. It should be noted that a high level at the output terminal VGP is equal to (Vcc−Vf), where Vf is a pn junction built-in potential of the pn junction diode. Furthermore, an inverted signal /EN obtained by inverting the input signal EN is output onto the output VGN of the inverter INV5. It should be noted that a high level of the output VGN is equal to (Vcc−Vf). Since the outputs VGP and VGN are gate signals of the P and N channel MOS transistors P1 and N1 of the switching section, respectively, these outputs VGP and VGN make the analog switch turn ON/OFF in accordance with the enable signal /EN which is a control signal.

Therefore, when the power source potential Vcc is being applied to the node 10, the analog switch is turned on, with the enable signal /EN of a high level, for example, the power source level Vcc. On the other hand, in the case where the enable signal /EN is low in level, for example, the ground potential, the analog switch is turned off.

Here, it is supposed that the potential (Vcc−Vf) is supplied to the output terminal VGP and the power source potential Vcc is input to the output terminal OUT1. In this situation, the P channel MOS transistor P1 is usually hard to turn off. However, the potential difference between the gate and the source of the P channel MOS transistor will be (Vcc−Vf)=−Vf. At this time, the relation represented by the formula (1) holds.

$$/Vtp(P1)/>>Vf \quad (1)$$

Therefore, it may be considered that the P channel MOS transistor P1 is turned off. The reason for this is as follows. When the potential at the output terminal VGP is equal to the potential (Vcc−Vf), a current flowing through the current path to the ground potential node against the backgate Nw of the P channel MOS transistor P1 is only a leak current. The value of Vf is not equal to about 0.6V, but it is close enough to be 0V.

Next, an operation of the analog switching circuit will be described at the time when the analog switching circuit is in the non-operation state, specifically when the ground potential is supplied to the node 10 with the changeover switch SW. Here, in the state where the other analog switching circuit 502 outputs a potential Vh higher than the ground potential, for example, in the state where the circuit 502 outputs the Vcc level, a potential higher than the ground potential is applied to the output terminal OUT1 of the analog switching circuit 504. As described above, in the conventional analog switching circuit, a large amount of the current I flows from the other analog switching circuit 502 to the output terminal OUT1 through the bus line 500.

However, in the analog switching circuit of this embodiment of the present invention, since the ground potential is applied to the node 10, the P type diffusion layer of the diode DD1 is grounded. Here, when it is assumed that the potential Vh higher than the ground potential is applied to the output terminal OUT1, a potential at the node Nw is raised to (Vh−Vf), which is higher than the ground potential, by the parasitic pn diode Dp formed between the backgate node Nw and the P type diffusion layer located on the side of the output terminal OUT1 of the P channel MOS transistor P1. This is because the diode DD1 comes to be in a reversely biased state and a path of a current flowing to the ground through the diode DD1 is not formed when the relation of Vh−Vf>0 holds. Therefore, the potential at the node Nw will be approximately equal to the potential Vh. With such operation, a potential approximately equal to the potential Vh is applied to the NAND gate NAND1 and the inverter INV5 as the power source potential.

Furthermore, as is clear with the reference to FIG. 2, one input terminal of the two input terminals of the NAND gate NAND1 is set to be the ground potential. Therefore, a current path between the output terminal VGP of the NAND gate NAND1 and the ground potential is not formed. Furthermore, since the gate of the P channel MOS transistor in the NAND gate NAND1 is set to be ground potential so that the P channel MOS transistor is in turning ON state, the output terminal VGP and the node Nw are in a contacted state through the source and drain of the transistor. Therefore, the potential at the node Nw is transmitted to the output terminal VGP through the P channel MOS transistor. In the P channel MOS transistor P1, as to the potential difference between the gate and the source, the relation expressed by the formula (Vh−Vf)−Vh=−Vf holds. As described above, the following formula holds.

$$/Vtp(P1)/>>Vf$$

Therefore, it may be considered that the P channel MOS transistor P1 will be turned off.

For this reason, in the P channel MOS transistor P1, a current (source and drain current) never flows constantly through the P channel MOS transistor, the current being one flowing through an ordinary MOS transistor. In addition, a current never flows constantly through the parasitic pn diode Dp.

On the other hand, the output terminal VGP of the NAND gate NAND1 is connected to the input terminal of the inverter INV5. As described above, since the potential at the output terminal VGP is equal to (Vh−Vf), the P channel MOS transistor in the inverter INV5 for connecting the output terminal VGN and the node Nw is turned off, and the N channel MOS transistor in the inverter INV5 for connecting its output terminal VGN and the ground potential is turned on. Thus, the potential at the output terminal VGN becomes equal to be the ground potential, which is 0V. Therefore, the N channel MOS transistor is made to be in turning off state.

In the analog switching circuit device of the first embodiment of the present invention, when the power source potential Vcc is applied to the node 10, the signal ranging from the ground potential to the power source potential can be transmitted. On the other hand, when the node 10 is set to be the ground potential, no current flows from the output terminal OUT1 to the ground potential.

Next, a circuit diagram of the analog switching circuit of a second embodiment according to the present invention will be described in FIG. 4.

In the first embodiment, the power source terminal of the inverter INV5 (it is equivalent to the node 20 of FIG. 3) is connected to the node Nw. In the second embodiment, the power source terminal of the inverter INV5 is directly connected to the node 10.

In this case, when the node 10 is set to be the ground potential, the output VGN of the inverter INV5 will be approximately equal to the ground potential, so that the N channel MOS transistor N1 will be turned off. Specifically, as shown in FIG. 3, though the P channel MOS transistor in the inverter INV5 is turned on with the input IN, the ground potential at the node 10 is output onto the output terminal VGN. In this embodiment, when the power source potential Vcc is applied to the node 10, the output from the inverter INV5 can be swinged from the ground potential to the power source potential Vcc.

In the first and second embodiments, the case where the NAND gate NAND1 has the two input terminals including the node 10 was shown. However, it is possible to apply the present invention to the case where the NAND gate NAND1 has more than two input terminals.

Figure 5:
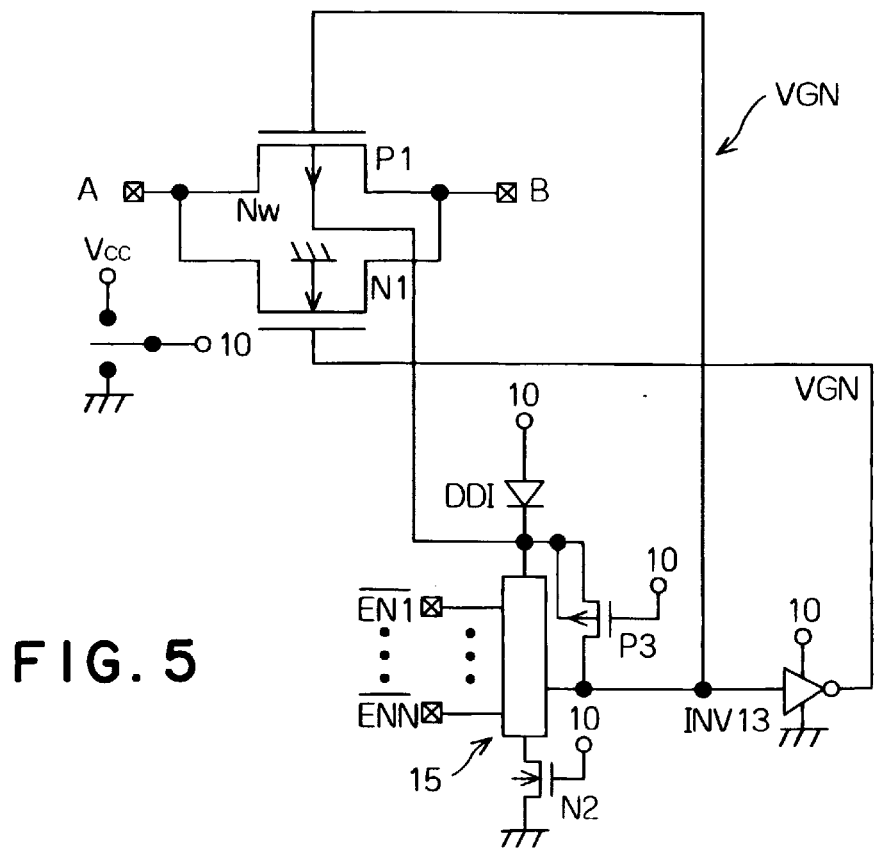
FIG. 5 is a circuit diagram of a third embodiment of an analog switching circuit device according to the present invention.

In FIG. 5, a circuit diagram of the analog switching circuit according to a third embodiment will be described. In FIG. 5, instead of the NAND gate NAND1 in FIGS. 1 and 3, a logic circuit 15 is provided, which is composed of a logic circuit N2 receiving N signals /EN1 to /ENN, a P channel MOS transistor P3 and an N channel MOS transistor N2. The gates of the P and N channel MOS transistors P3 and N2 are connected to the node 10. Specifically, in the logic circuit 15, instead of the one enable input /EN of the NAND gate NAND1 in FIG. 1 or FIG. 3, a plurality of input terminals /EN1 to /ENN are used. In FIG. 5, a power source node of the inverter INV13 is, for convenience, connected to the node 10. It should be noted that the power source node may be connected to one terminal of the diode DD1.

In such constitution, in case where the power source voltage Vcc is supplied to the node 10, the P channel MOS transistor P3 is turned off, and the N channel MOS transistor N2 is turned on. Then, the potential of the output VGP is controlled in accordance with the state of the N signals /EN1 to /ENN. Although the high level of the output VGP is equal to about Vcc-Vf, the circuit in FIG. 5 operates sufficiently as the analog switch. In case where the ground potential is supplied to the node 10, the N channel MOS transistor N2 is turned off, and the P channel MOS transistor P3 is turned on, whereby the potential at the node Nw is applied to the gate of the P channel MOS transistor P1 through the P channel MOS transistor P3. Therefore, as described in the operation of the circuit in FIG. 1, the P channel MOS transistor P1 will be turned off. Moreover, it is necessary to arrange the N channel MOS transistor N2 so as to cut off the current path between the output VGP and the ground poten-tial. For this purpose, it suffices that the N channel MOS transistor N2 may be arranged between a terminal close to the ground potential side of the logic circuit and the ground potential terminal.

A circuit diagram of the logic circuit 15 will be exemplified in FIGS. 6A and 6B.

In FIGS. 6A and 6B, a P channel MOS transistor circuit 15-p and N channel MOS transistor circuits 15-n-1 and 15-n-2 are in a complementary relation with respect to each of the inputs /EN1 to /ENN. Furthermore, the N channel MOS transistor N2 can be arranged in a proper position as shown in FIGS. 6A and 6B.

Furthermore, another circuit constitution diagram of the logic circuit is exemplified in FIG. 7.

Similar to FIGS. 6A and 6B, a P channel MOS transistor 15-p and N channel MOS transistors 15-n-1 and 15-n-2 are in complementary relation. In such manner, each circuit is divided properly and the circuit can be constituted by arranging the N channel MOS transistor N2 in a proper position.

A circuit diagram of the analog switching circuit of a fourth embodiment of the present invention will be described in FIG. 8.

Figure 4:
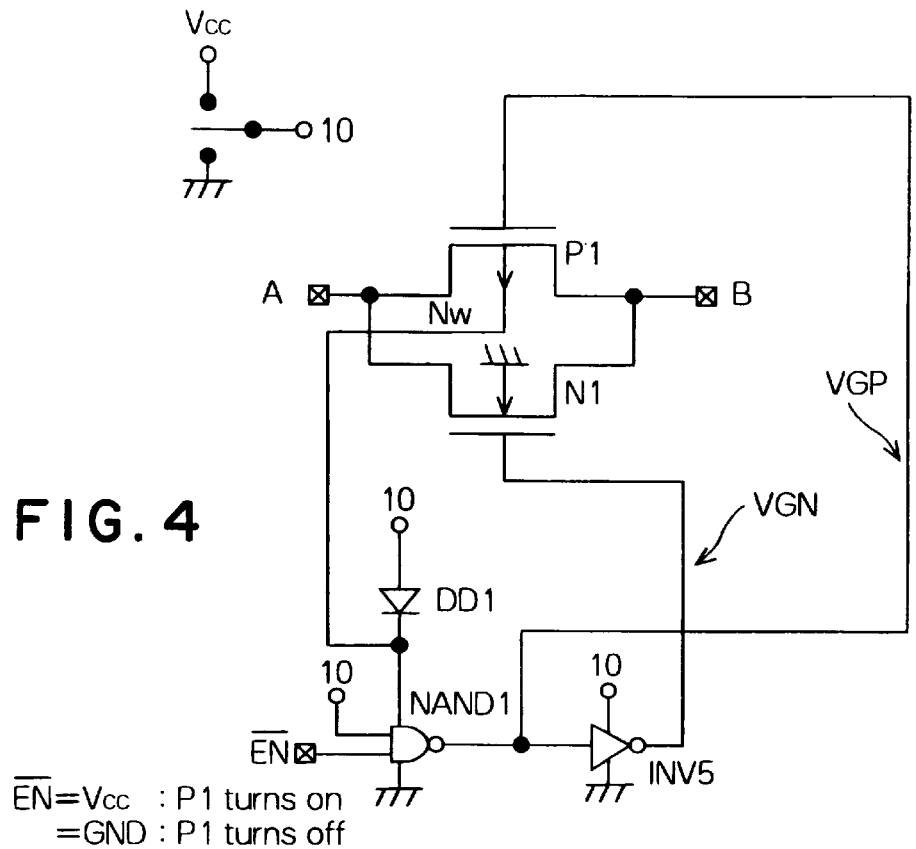
FIG. 4 is a circuit diagram of a second embodiment of an analog switching circuit device according to the present invention.

In the above described analog switching circuit of FIGS. 1 and 4, the enable signal /EN is input to one terminal of the two-input NAND gate NAND1, and an input supplied to the other input terminal is set to be the potential at the node 10. With such constitution, when the node 10 is set to be the ground potential, the circuit is designed such that the operation thereof may have no relation with a level of the enable signal /EN. On the contrary, in the fourth embodiment of the present invention shown in FIG. 8, when the node 10 is set to be the ground potential, a premise that the enable signal /EN is always equal to the ground potential holds. Because such premise, the arrangement of the NAND gate NAND1 is not necessary as in FIG. 1, instead of the NAND gate NAND1, an inverter INV8 is used in FIG. 8.

Specifically, as is apparent when FIG. 3 is referred, when the node 10 is switched to the ground potential, an N channel MOS transistor in the inverter INV8 is turned off, whereby no current path between the output VGP and the ground potential is formed. Moreover, a P channel MOS transistor in the inverter INV8 is in a turning off state because the gate thereof is set to be the ground potential. Therefore, a path between the output VGP and the backgate node Nw is in connection state with the source and drain terminals. Then, a potential at the node Nw is transmitted to the output VGP through this P channel MOS transistor. Therefore, in the same manner as the first embodiment, the P channel MOS transistor P1 may be considered to be turned off.

Therefore, in the P channel MOS transistor P1, a current (drain and source current) as in MOS transistors never flows constantly and a current though the parasitic pn junction diode Dp never flows constantly.

Figure 9:
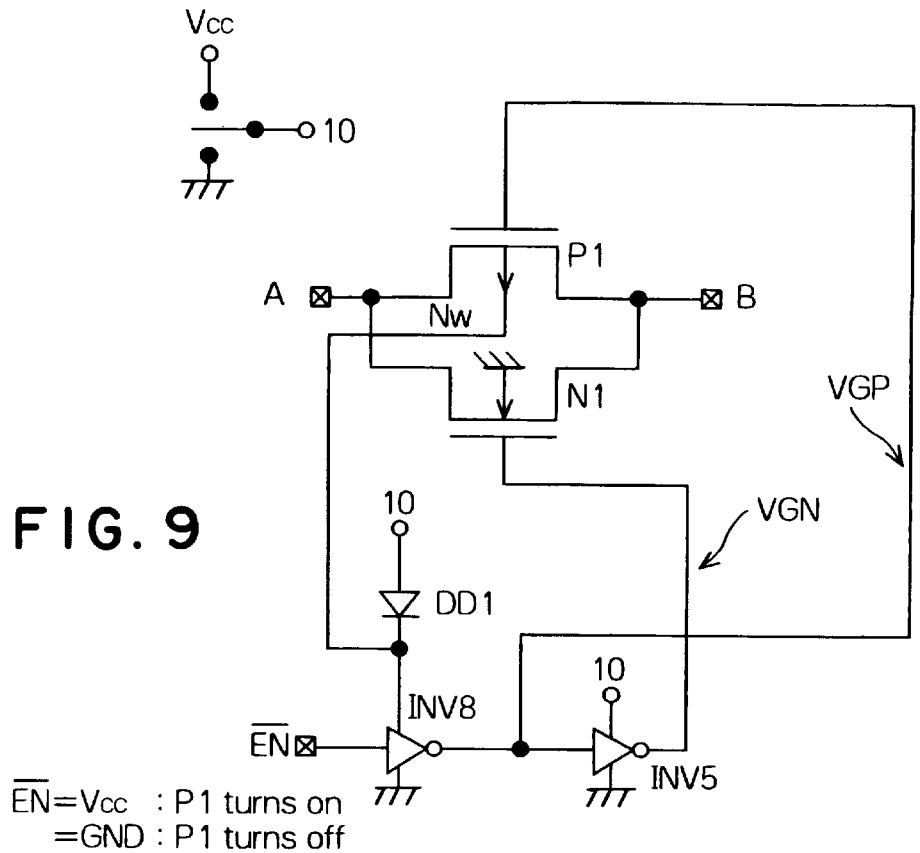
FIG. 9 is a circuit diagram of a fifth embodiment of an analog switching circuit device according to the present invention.

A circuit diagram of the analog switching circuit of a fifth embodiment according to the present invention will be shown in FIG. 9.

In the analog switching circuit of the fifth embodiment shown in FIG. 9, when the node 10 is set to be the ground potential, the fifth embodiment is one in case where the premise that the enable signal /EN is usually set to be the ground potential holds. Because of existence of such premise, usage of the NAND gate NAND1 which is needed in FIG. 1 is unnecessary. Instead of the NAND gate NAND1, an inverter INV8 is used in FIG. 9.

Moreover, the output VGP of the inverter INV8 is connected to the input of the inverter INV5. In this case, when the node 10 is set to be the ground potential, the output VGN of the inverter INV5 will always be approximately equal to the ground potential, whereby the output VGN forces the N channel MOS transistor N1 to turn off. Specifically, this is because the ground potential at the node 10 is output onto the output terminal VGN, if the P channel MOS transistor in the inverter INV5 were turned on, as shown in FIG. 3. In this embodiment, when the power source potential Vcc is applied to the node 10, the output of the inverter INV5 can always swing from the ground potential to the power source potential Vcc.

In the fourth embodiment, when the node 10 is switched to the ground potential, the enable signal /En as the input supplied to the inverter INB8 is always ground potential.

As to the circuit having the above described constitution, modification for the case of multi-input more than one can be allowed.

Figure 10:
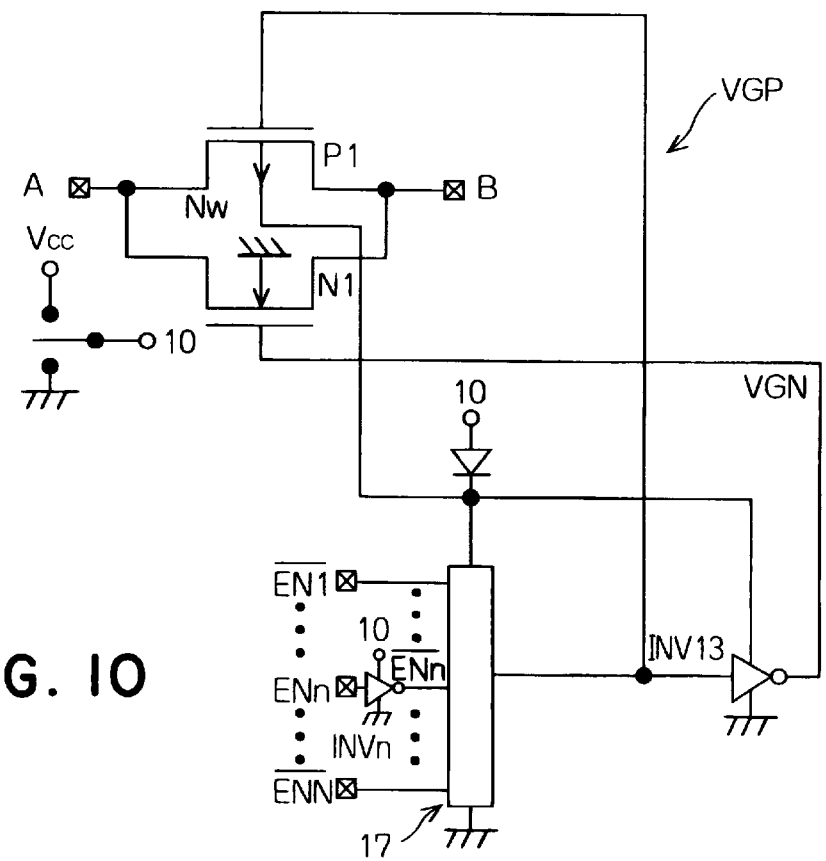
FIG. 10 is a circuit diagram of a sixth embodiment of an analog switching circuit device according to the present invention.

In FIG. 10, a circuit diagram of the analog switching circuit of a sixth embodiment of the present invention will be described. In FIG. 10, instead of the inverter INV8, a circuit 17 for receiving N signals /EN1 to /ENN is provided between the node Nw and the ground potential. A signal /ENn is input to the circuit 17 through an inverter INVn. The inverter INVn receives a power potential from the node 10. Therefore, when the node 10 is in level of the ground potential, the output of the node 10 will be approximately equal to the ground potential. Specifically, the input /ENn from the inverter INVn to the circuit 17 satisfies the premise that the enable signal /EN is always set to the ground potential when the node 10 is switched to the ground potential. A desired performance can be obtained, if the circuit 17 is constituted such that, when the output of the inverter INVn become equal to the ground potential, the current path between the node VGP and the ground potential terminal is cut off and the potential at the node Nw is transferred to the node VGP.

Figure 11:
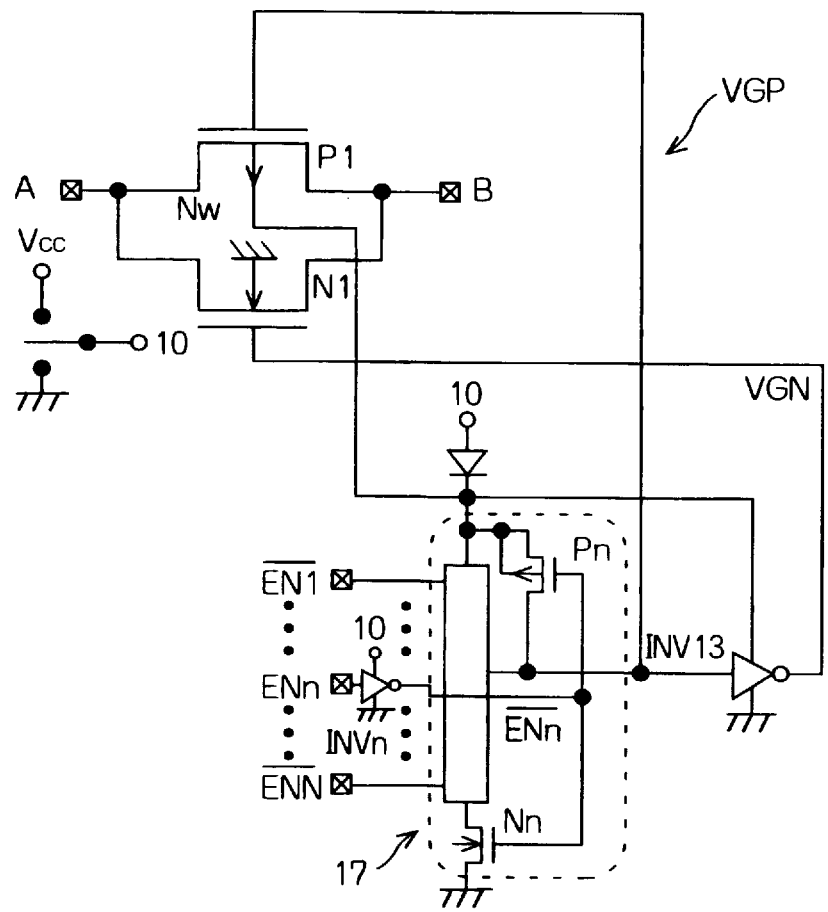
FIG. 11 is a modification example of the fifth embodiment of the analog switching circuit device according to the present invention.

An example of the circuit 17 of the analog switching circuit of the sixth embodiment according to the present invention is shown in FIG. 11. The circuit 17 of FIG. 11 shows a case where the desired performance is obtained only with a single /ENn, and the circuit 17 operates in the similar manner.

Figure 12A:
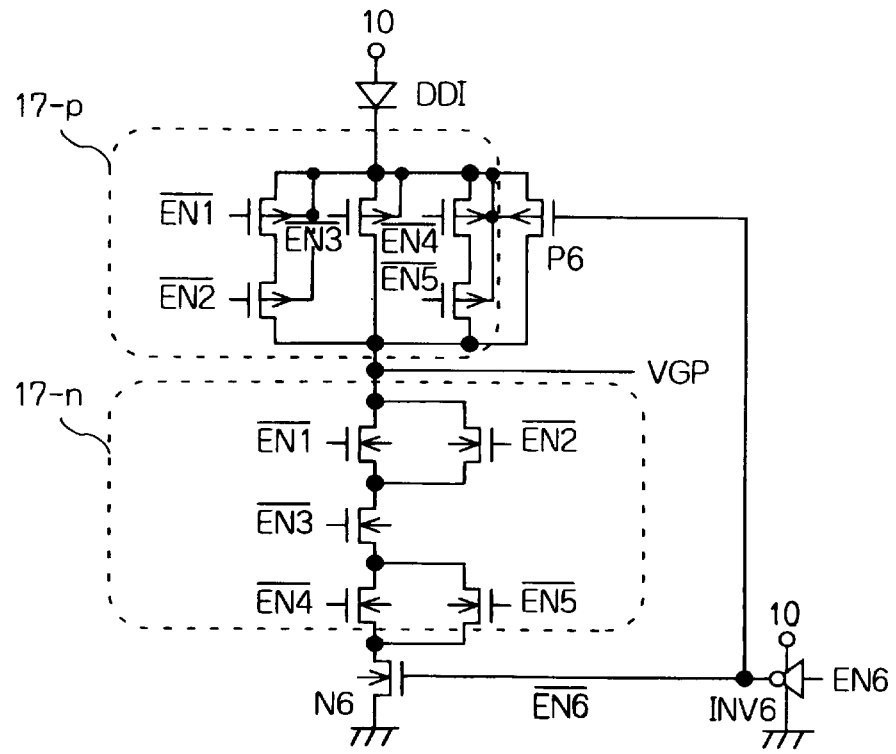
FIG. 12A and 12B are a circuit constitution example exemplifying a logic circuit 17 of FIGS. 10 and 11.
Figure 12B:
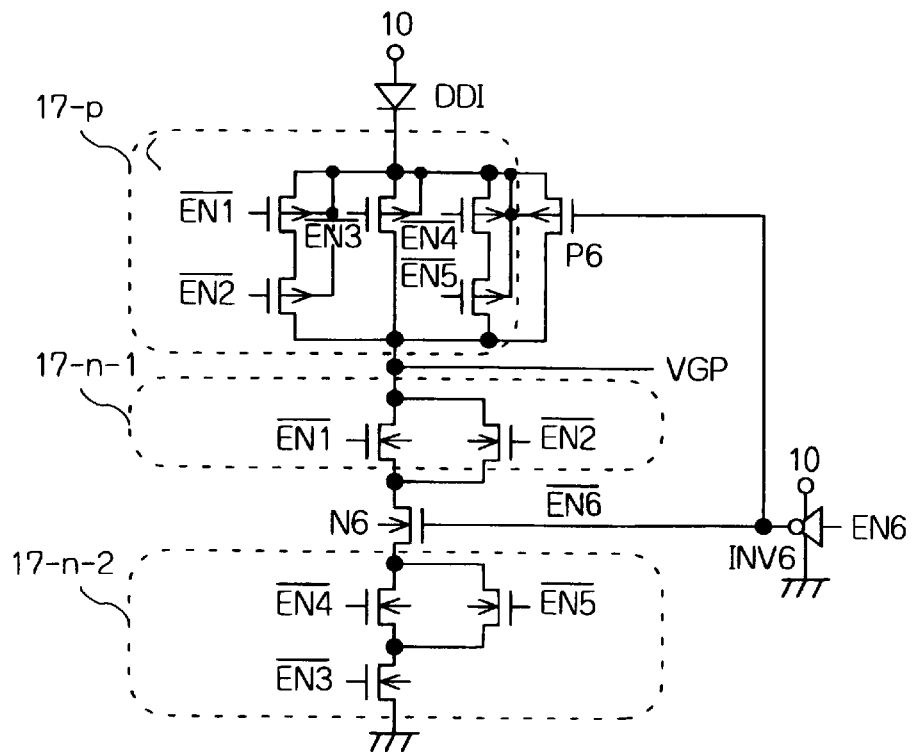

Examples of the circuit diagram in which the logic circuit 17 and the inverter are used are shown in FIGS. 12A and 12B.

In FIG. 12A, the P channel MOS transistor circuit 15-p and the N channel MOS transistor circuit 15-n are in complementary relation with respect to each of the inputs /EN1 to /EN5. Moreover, the N channel MOS transistor N2 can be provided at a proper position so as to cut off the current path between the node VGP and the ground potential.

Furthermore, another example of the circuit diagram of the logic circuit 15 is shown in FIG. 12B.

Similar to FIG. 12A, the P channel MOS transistor circuit 17-p and the N channel MOS transistor circuits 17-n-1 and 17-n-2 are in complementary relation.

Then, the above transistor circuits are properly divided, the circuit is constituted by arranging the N channel MOS transistor N2 at a proper position such that the current path between the node VGP and the ground potential is cut off.

In FIG. 11, the case where the desired performance can be obtained with the single signal Nn was described. If the acquisition of the desired performance is required when the a plurality of signals are set to the ground potential, the plurality of the signals may be input to the circuit 17 through the inverter INVn.

Figure 13:
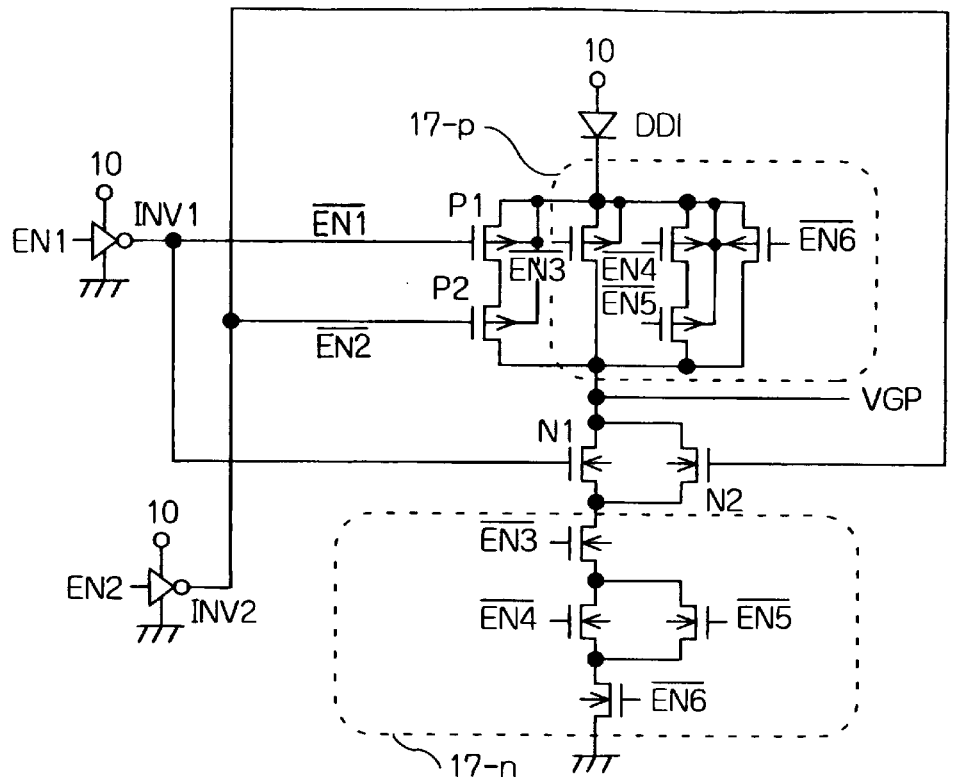
FIG. 13 is another circuit constitution example exemplifying a logic circuit 17 of FIGS. 10 and 11.

Another circuit diagram of the logic circuit 17 is shown in FIG. 13.

Here, a plurality of circuits similar to the inverter INVn are provided, P and N channel MOS transistors P1, P2, and N1 and N2 corresponding to the circuits are provided.

Figure 14:
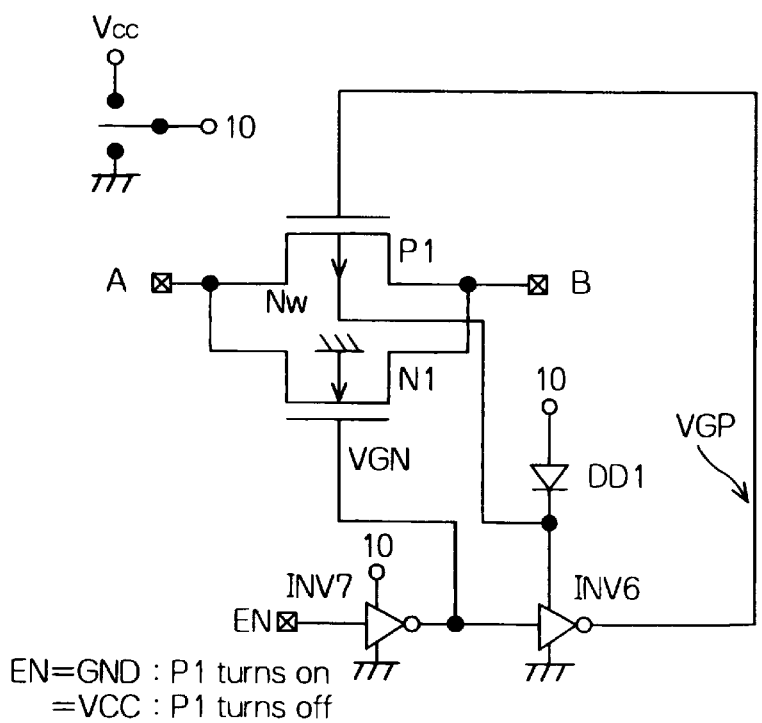
FIG. 14 is a circuit diagram of a seventh embodiment of an analog switching circuit device according to the present invention.

A circuit diagram of the analog switching circuit of a seventh embodiment according to the present invention is shown in FIG. 14. In the foregoing analog switching circuits of FIGS. 1 and 3, the enable signal /EN is input to one input terminal of the two input NAND gate NAND1, and the other input terminal thereof is set to the potential at the node 10. With such constitution, when the node 10 is set to the ground potential, the circuit operates regardless of the level of the enable signal /EN. Moreover, in the analog switching circuit of FIGS. 8 and 9, it was supposed that the proposition that the enable signal /EN is always in the level of the ground potential holds when the node is 10 set to the ground potential. In such situation, the circuit of the seventh embodiment shown in FIG. 14 is designed such that the circuit operates irrespective of the level of the enable signal /EN when the node 10 is switched to the ground potential.

The enable signal EN is input to the inverter INV7. The inverter INV7 is denoted by the symbol of FIG. 3A and is provided with the constitution of FIG. 3B. The node 20 in FIG. 3A is connected to the node 10 in FIG. 14. The output VGN of the inverter INV7 is connected to the gate of the N channel MOS transistor N1, and the output of the inverter INV7 serves as the input signal of the inverter INV6. The output terminal VGP of the inverter INV6 is connected to the gate of the P channel MOS transistor P1. The inverter INV6 is denoted by the symbol of FIG. 3A and is provided with the circuit constitution of FIG. 3B. The node 20 in FIG. 3A is connected to the node 10 through the diode DD1 in FIG. 14. The node corresponding to the foregoing node 20 is further connected to the backgate node Nw of the P channel MOS transistor P1. With the application of the power source potential Vcc to the node 10 with the changeover switch SW, the analog switching circuit is made ON, when the enable signal EN is either in the ground potential or in the low level. Moreover, with the application of the power potential Vcc to the node 10, the analog switching circuit is made OFF, when the enable signal EN is either in the power source potential Vcc or in the high level.

Here, a concrete description for an operation of the analog switching circuit when the power source potential Vcc is applied to the node 10 will be made. Since the power source potential Vcc is applied to the inverter INV7, an inverter signal /EN of the input signal EN is output to the output terminal VGN, whereby the ON/OFF operation of the N channel MOS transistor N1 is controlled. The output VGN is supplied to the inverter INV6 as its input signal. A signal of the same logic level as that of the input signal EN is output to the output terminal VGP of the inverter INV6. It should be noted that a high level of the output VGP is equal to Vcc−Vf, where "Vf" represents a pn junction built-in potential of the pn junction diode DD1. Since the outputs VGP and VGN are gate signals supplied to the P and N channel MOS transistors P1 and N1 in the analog switching circuit, respectively, the analog switching circuit is caused to turn on/off in accordance with the level of the control signal EN. Similar to the description for the first embodiment of FIG. 1, the P channel MOS transistor P1 may be considered to turn off when the potential (Vcc−Vf) is applied to the output terminal VGP.

Next, an operation when the ground potential is applied to the node 10 with the changeover switch SW will be described. Since the ground potential is applied to the node 10, the output VGN from the inverter INV7 will be equal approximately to the ground potential regardless of the level of the input signal EN, as is clear when referring to FIG. 3. Therefore, the N channel MOS transistor N1 is in a turning-off state. Moreover, since the ground potential is applied to the node 10, a P diffusion side of the diode DD1 is in the level of the ground potential.

Here, it is assumed that a potential Vh higher than the ground potential is applied to one terminal, for example, a terminal B. A potential at the node Nw becomes equal to the potential (Vh–Vf), that is, the potential at the node Nw is increased to a potential higher than the ground potential. This is because if the formula Vh–Vf>0 holds, the diode DD1 is reversely biased so that no current path to the ground potential terminal through the diode DD1 is formed. Therefore, the a potential at the node Nw becomes approximately equal to the potential Vh. By the above described mechanism, a potential approximately equal to the potential Vh is applied to the power source potential of the inverter INV6.

Since the potential at the input terminal VGN of the inverter INV6 is in the level of the ground potential, the N channel MOS transistor in the inverter INV6 turned off as shown in FIG. 3. Therefore, no current path between the output node VGP and the ground potential terminal exists. Moreover, as shown in FIG. 3, the output terminal VGP and the node Nw are connected with the source and drain terminals of the P channel MOS transistor in the inverter INV6, which is being turned on by setting the gate thereof to the ground potential. Therefore, the potential at the node Nw is transmitted to the output terminal VGP through the P channel MOS transistor in the inverter INV6. The potential difference between the gate and the drain of the P channel MOS transistor P1 is given by the formula (Vh–Vf)–Vh=–Vf. As described above, since the formula /Vtp(P1)/>>Vf holds, the P channel MOS transistor P1 is considered to be turned off. Therefore, in the P channel MOS transistor P1, a current flowing through a MOS transistor, that is, a drain-source current, as well as a current through a parasitic pn diode, does not usually flow.

In the foregoing embodiment, the description for the case of the one-input terminal INV7 was made. Modification in case of multi-input inverter having more than two-input terminals can be executed.

Figure 15:
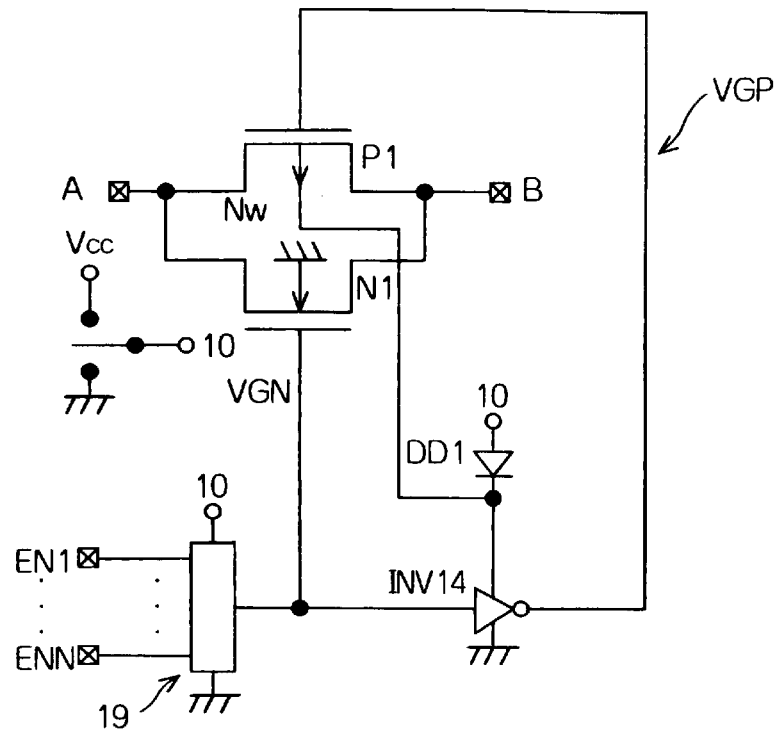
FIG. 15 is a circuit diagram of an eighth embodiment of an analog switching circuit diagram having multi-input terminals according to the present invention.

In FIG. 15, a circuit diagram of the analog switching circuit of an eight embodiment having multi-input terminals is shown.

In the eighth embodiment, instead of the inverter INV7 in FIG. 7, a logic circuit 19 receiving N signals EN1 to ENN is provided. When the node 10 is set to the ground potential, the output terminal VGN of the circuit 19 becomes approximately equal to the ground potential, whereby a desired performance can be obtained.

As described above, the circuit of the foregoing embodiment can transfer a signal having a potential level ranging from the ground potential to the power source potential when the power source potential Vcc is applied to the node 10. Even when the node 10 is set to the ground potential, no current flows from the terminals A and B to the ground potential terminal.

The logic circuit 19 comprises the node 10 as a power source node. When the node 10 is set to the ground potential, the potential at the output terminal VGN must be in the ground potential regardless of the level of the input signal.

Figure 16:
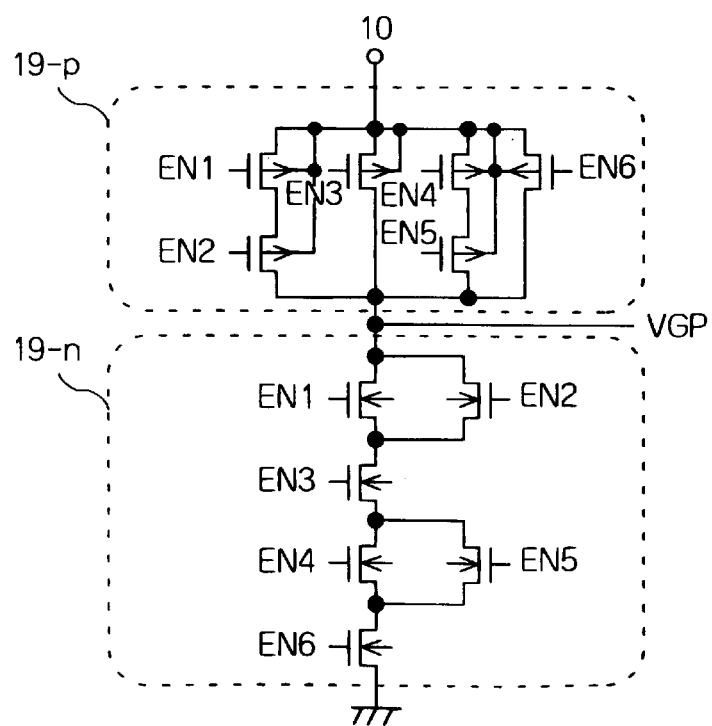
FIG. 16 is a circuit constitution example exemplifying a logic circuit 19 of FIG. 15.

In FIG. 16, an example of the circuit constitutional diagram of the logic circuit 19 is shown.

The P channel MOS transistor circuit 19-p and the N channel MOS transistor circuit 19-n are in complementary relation with respect to the input signals EN1 to EN6.

Figure 17:
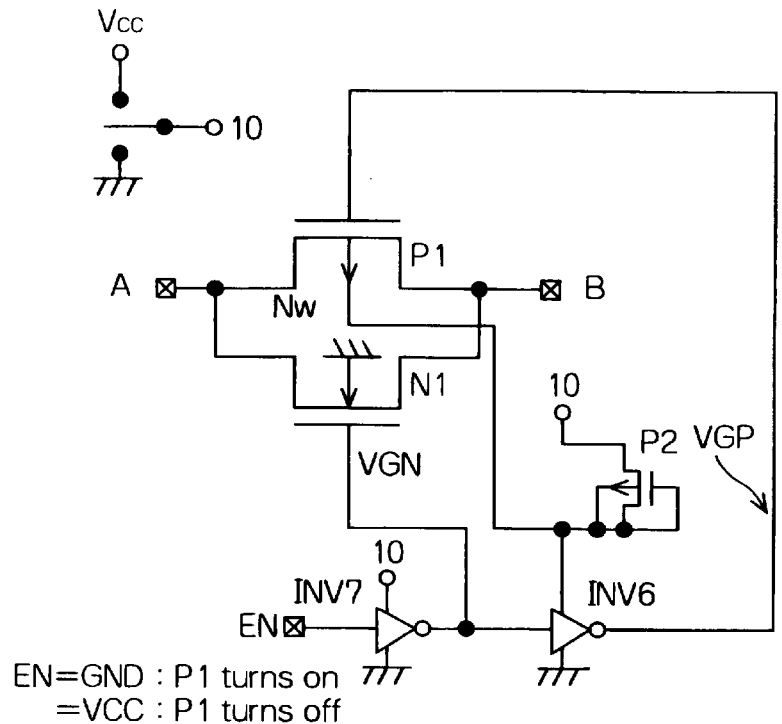
FIG. 17 is a circuit diagram for forming a diode DD1.

In FIG. 17, an example of the circuit diagram for forming the diode DD1 is shown. In FIG. 17, the P channel MOS transistor P2 is provided, a source of which is connected to the node 10. A drain, a gate and a backgate of the P channel MOS transistor P2 are connected to the node Nw. Therefore, the diode DD1 can be defined as a diode formed between the P type source diffusion layer of the P channel MOS transistor P2 and the backgate-node Nw.

Figure 18:
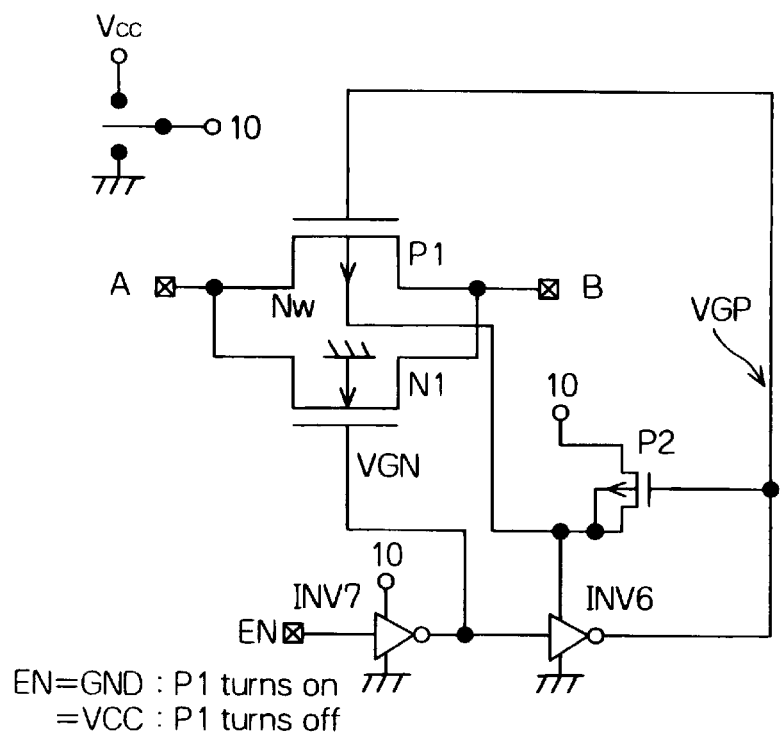
FIG. 18 is a circuit diagram relating to a gate connection of a P channel MOS transistor forming the diode DD1.

Moreover, in FIG. 18, a circuit diagram relating to the gate connection of the P channel MOS transistor P2 forming the diode DD1 is shown. In FIG. 18, the output terminal VGP of the inverter INV6 is connected to the gate of the P channel MOS transistor P2. With such constitution, in a situation where the power source potential Vcc is supplied to the node 10, when the output VGP of the inverter INV6 is equal to the ground potential, the node Nw can be biased up to the power source potential Vcc supplied from the node 10.

Figure 19:
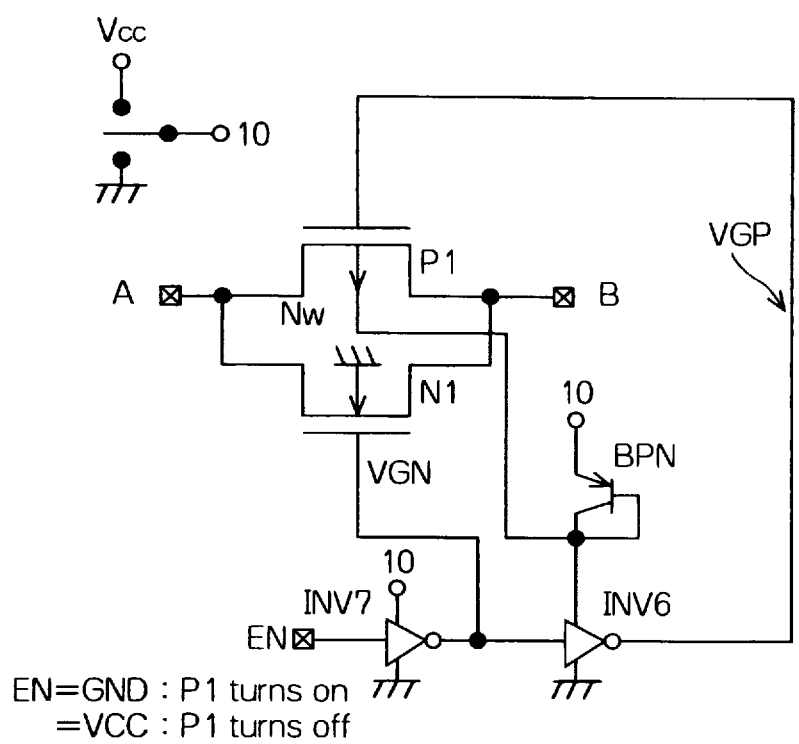
FIG. 19 is another circuit diagram for forming the diode DD1.

In FIG. 19, another circuit diagram for forming the diode DD1 is shown. Here, a pnp bipolar transistor BPN is provided, an emitter of which is connected to the node 10 and a collector and base of which are connected to the node Nw. Therefore, the diode DD1 can be defined as a diode formed between a P type emitter diffusion layer of the bipolar transistor BPN and the base thereof.

Furthermore, FIG. 20 shows a circuit diagram relating to the base connection of the pnp bipolar transistor BPN forming the diode DD1. Here, the output terminal VGP of the inverter INV6 is connected to the base of the bipolar transistor BPN. With such constitution, in a situation where the power source potential Vcc is supplied to the node 10, when the output VGP of the inverter INV6 is equal to the ground potential, the backgate-node Nw can be biased up to the power source Vcc supplied from the node 10.

Here, in the example of the circuit diagram of the analog switching circuit illustrated in the descriptions of the foregoing embodiments, the high level of the output VGP is equal to Vcc–Vf, and the high level of the output VGN is also Vcc–Vf in the embodiments shown in FIGS. 1 and 8. In a situation where the power source potential Vcc is supplied to the node 10, in other words, in a situation where the analog switching circuit operates normally, it is desirable that the outputs VGN and VGP perform full-swinging. In the following embodiments, constitutions satisfying such requirement will be shown.

In FIG. 21, a circuit diagram of the analog switching circuit of a ninth embodiment of the present invention will be illustrated. This embodiment is principally composed of the analog switching circuit shown in FIG. 17 and further comprises a bias circuit 11. In the circuit diagram of FIG. 21, instead that the gate of the P channel MOS transistor P2 is connected to the drain thereof, the gate of which is connected to the output node 18 of the bias circuit 11. The bias circuit 11 consists of the inverter INV9, and the power source terminal of the inverter INV9 which corresponds to the node 20 of FIG. 3B is connected to the node Nw. The inverter INV9 comprises an input terminal connected to the node 10 and a node 18 as an output terminal.

Next, an operation of the analog switching circuit shown in FIG. 21 will be described.

In case where the power source potential Vcc is supplied to the node 10 with the changeover switch SW, the output node 18 of the inverter INV9 becomes equal to the ground potential. Therefore, the P channel MOS transistor P2 is turned on and the node Nw becomes equal to the potential at the node 10, that is, the power source potential Vcc, whereby the output VGP performs full-swinging.

On the other hand, in a case where the ground potential is supplied to the node 10 with the changeover switch SW, the potential at the input terminal of the inverter INV9 is also equal to the ground potential. Therefore, as is clear from FIG. 3, the N channel MOS transistor constituting the inverter INV9 is turned off, and the P channel MOS transistor thereof is turned on. The potential at the backgate-node Nw is transmitted to the gate of the P channel MOS transistor P2 through this P channel MOS transistor of the inventer INV9. Therefore, since the analog switching circuit of FIG. 21 performs the same operation as that of the analog switching circuit shown in FIGS. 14 and 17, the analog switching circuit of FIG. 21 never causes current to flow, the current being the problems concerned in the conventional circuits.

Figure 22:
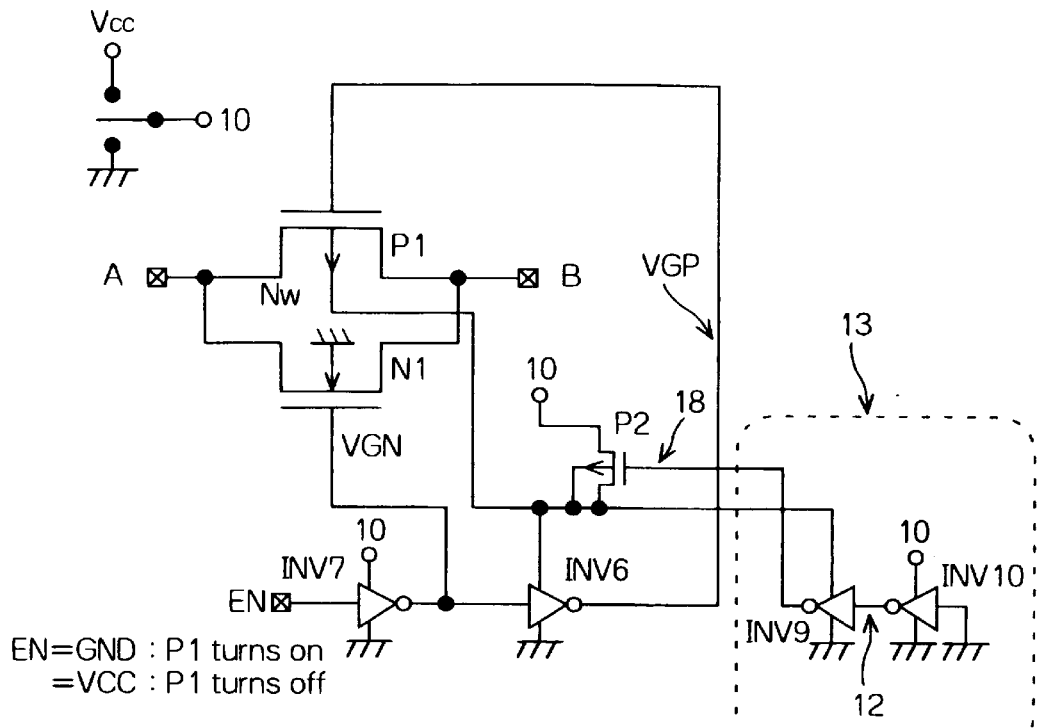
FIG. 22 is a circuit diagram of a tenth embodiment of an analog switching circuit device according to the present invention.

A circuit diagram of the analog switching circuit of a tenth embodiment according to the present invention is illustrated in FIG. 22.

FIG. 22 shows a constitution in which another bias circuit 13 is provided instead of the bias circuit 11 shown in FIG. 21. The bias circuit 13 includes two inverters INV9 and INV10. The inverter INV9 receives the output from the inverter INV10. The power source terminal of the inverter INV10 which corresponds to the node 20 of FIG. 3 is connected to the node 10. Moreover, the input terminal of the inverter INV10 is connected to the ground potential. In a situation where the power source potential Vcc is supplied to the node 10, since the P channel MOS transistor in the inverter INV10 is in a turning-on state as shown in FIG. 3, the output node 12 of the inverter INV10 is in a level of the power source potential Vcc. Therefore, an operation of the analog switching circuit shown in FIG. 22 is similar to that of the analog switching circuit of FIG. 21. On the other hand, in a situation where the ground potential is supplied to the node 10, since the potential at the node 12 is approximately equal to the ground potential, the operation of the analog switching circuit of FIG. 22 is similar to that of the analog switching circuit of FIG. 21.

Furthermore, in the analog switching circuit shown in FIGS. 21 and 22, the output node 18 in either the bias circuit 11 or the bias circuit 13 was connected to the gate of the P channel MOS transistor P2. In the analog switching circuit shown in FIG. 19, when the base of the pnp bipolar transistor BPN is not connected to the collector thereof, but the output node 18 of the bias circuit is connected to the base thereof as shown in FIGS. 21 and 22, the same effects as the cases shown in FIGS. 21 and 22 can be obtained.

In the foregoing embodiments, the analog switching circuits have a CMOS analog switching circuit constitution by providing the N channel MOS transistor N1. However, an analog switching circuit composed of only the P channel MOS transistor P1 without using the N channel MOS transistor N1 and a driving circuit portion for the transistor N1 may be employed.

Figure 23:
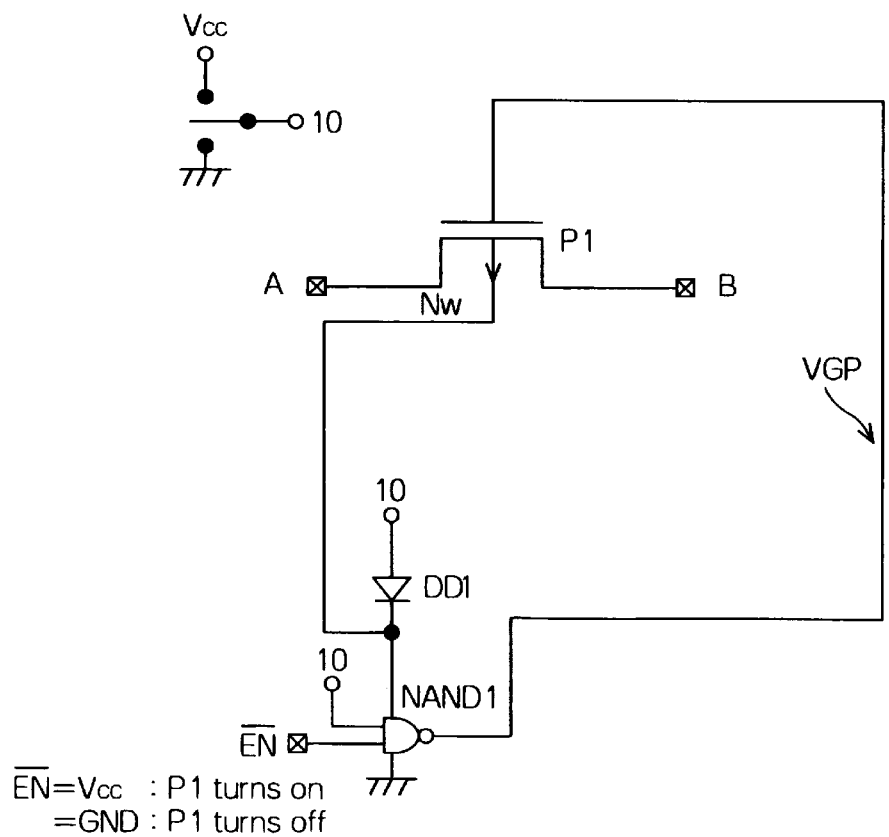
FIG. 23 is a circuit diagram of an analog switching circuit formed by only a P channel MOS transistor P1.

A circuit diagram of the analog switching circuit composed of only the P channel MOS transistor P1 is shown in FIG. 23. An operation of the analog switching circuit of FIG. 23 is similar to that of the circuit of the first embodiment composed of the P channel MOS transistor P1.

Furthermore, also in other embodiments, similarly, by deleting the N channel MOS transistor N1 and the driving circuit for the transistor N1, an analog switching circuit comprising only the P channel MOS transistor P1 can be constituted.

Furthermore, by properly combining the circuit constitution of each embodiment, an analog switching circuit which is capable of performing a desired operation can be obtained.

Although the preferred embodiments of the present invention has been described in detail, it should be understood that various changes, substitutions and alternations can be made therein without departing from spirit and scope of the inventions as defined by the appended claims.

What is claimed is:

1. An analog switching circuit comprising:
   a switching section including a first MOS transistor having a source, a drain, a gate and a backgate; and
   a control section for providing an input signal supplied from one terminal of said switching section to the other terminal by on/off control,
   wherein said control section includes
   a diode, one terminal of which is connected to said backgate of said first MOS transistor;
   a changeover switch connected to the other terminal of said diode for switching a connection of the other terminal of said diode to either a power source potential or a ground potential; and
   a control circuit connected to a connection node of said diode and said backgate of said first MOS transistor for receiving a control signal and for supplying a potential at said connection node to said gate of said first MOS transistor in accordance with a connection state of said changeover switch with said power source potential or said ground potential.

2. The analog switching circuit according to claim 1, wherein said control circuit performs a control operation by supplying a potential in accordance with said control signal to said gate of said first MOS transistor when said changeover switch selects the power source potential, and said control circuit causes said first MOS transistor to turn off by supplying a backgate potential of said first MOS transistor to the gate thereof when said changeover switch selects the ground potential.

3. The analog switching circuit according to claim 1, wherein said control circuit comprises
   a first logic gate which has one input terminal for receiving said control signal, the other input terminal for receiving either said power source potential or said ground potential through said changeover switch, and a power source terminal connected to said connection node, said first logic gate supplying an output to the gate of said first MOS transistor, and
   wherein when said changeover switch is switched to the ground potential, the backgate potential of said first MOS transistor is supplied to an output terminal of said first logic gate.

4. The analog switching circuit according to claim 3, wherein said logic gate is either a NAND gate or an AND gate.

5. The analog switching circuit according to claim 1, wherein said control circuit comprises
   a first logic circuit which has a plurality of input terminals for receiving a plurality of control signals and a power source terminal connected to said connection node, said first logic circuit supplying an output to the gate of said first MOS transistor;
   a second MOS transistor having one terminal connected to said connection node, the other terminal connected to an output terminal of said first logic circuit, and a gate connected to either the power source potential or the ground potential through said changeover switch, said second MOS transistor transmitting a backgate potential of said first MOS transistor to an output terminal of said first logic circuit; and a third MOS transistor arranged between the ground potential and the output terminal of said first logic circuit, a gate of which is connected to either the power source potential or the ground potential through said changeover switch, said third MOS transistor electrically separating said output terminal of said first logic circuit and the ground potential when the ground potential is selected by said changeover switch.

6. The analog switching circuit according to claim 1, wherein said control circuit comprises a logic gate having an input terminal for receiving the control signal and a power source terminal connected to said connection node, said logic gate supplying an output to the gate of said first MOS transistor, and wherein said control circuit supplies a backgate potential of said first MOS transistor to an output terminal of said logic gate when said changeover switch is switched to the ground potential.

7. The analog switching circuit according to claim 6, wherein said logic gate is composed of an inverter.

8. The analog switching circuit according to claim 1, wherein said control circuit comprises a logic circuit having a plurality of input terminals for receiving a plurality of control signals and a power source terminal connected to said connection node, said logic circuit supplying an output to the gate of said first MOS transistor; and an inverter having an input terminal for receiving any one of the control signals and a power source terminal connected to either the power source potential or the ground potential, said inverter supplying any one of the control signals to corresponding one of the input terminals of said logic circuit.

9. The analog switching circuit according to claim 1, wherein said control circuit comprises a first logic circuit having a plurality of input terminals for receiving a plurality of control signals and a power source terminal connected to said connection node, said first logic circuit supplying an output thereof to the gate of said first MOS transistor;

an inverter having an input terminal for receiving any one of said control signals and a power source terminal connected to either the power source potential or the ground potential through said changeover switch;

a second MOS transistor having one terminal connected to said connection node, the other terminal connected to an output terminal of said first logic circuit, and a gate connected to said inverter; and a third MOS transistor arranged between the ground potential and said first logic circuit, a gate of which is connected to said inverter; and wherein when the ground potential is selected by said changeover switch, a backgate potential of said first MOS transistor is transmitted to an output terminal of said first MOS transistor by said second logic circuit, and the ground potential and said output terminal of said first logic circuit are electrically isolated by said third MOS transistor.

10. The analog switching circuit according to claim 1, wherein said control circuit comprises a first logic gate having at least one input terminal for receiving a control signal and a power source terminal connected to either the power source potential or the ground potential through said changeover switch;

and a second logic gate having an input terminal connected to an output terminal of said first logic gate and a power source terminal connected to said connection node, said second logic gate supplying an output to the gate of said first MOS transistor; and wherein when the changeover switch is switched to the ground potential, a backgate potential of said first MOS transistor is supplied to an output terminal of said second logic gate.

11. The analog switching circuit according to claim 10, wherein said first and/or second logic gates are an inverter.

12. The analog switching circuit according claim 1, wherein said diode is a MOS transistor in which a gate and either a drain or a source is connected to said connection node, a backgate thereof is connected either said connection node or a gate of said first MOS transistor, and either the source or the drain thereof is connected to said changeover switch.

13. The analog switching circuit according to claim 1, wherein said diode is a npn bipolar transistor in which either an emitter or a collector thereof is connected to said connection node, the other is connected to said changeover switch, and a base thereof is connected to either said connection node or a gate of said first MOS transistor.

14. The analog switching circuit according to claim 1, wherein said diode is composed of a MOS transistor in which either a drain or a source is connected to said connection node, the other is connected to said changeover switch, and a backgate is connected to said connection node; and wherein a bias circuit connected to the gate of said MOS transistor and said connection node is provided, said bias circuit making said MOS transistor turn off when said changeover switch is switched to the ground potential and making said MOS transistor turn on when said changeover switch is switched to the power source potential.

15. The analog switching circuit according to claim 1, wherein said switching section is a CMOS analog switch composed of said first MOS transistor and a MOS transistor having an opposite channel type to that of said first MOS transistor, said first MOS transistor being coupled in parallel to said MOS transistor.

16. The analog switching circuit according to claim 15, wherein said control circuit comprises an inverter, an input terminal of which is connected to a gate of said first MOS transistor and a power source terminal of which is connected to said connection node, said inverter supplying an output to both of the gate of said first MOS transistor and a gate of said opposite channel type MOS transistor; and wherein said inverter outputs either the power source potential or the ground potential in accordance with a switched state of said changeover switch.

17. The analog switching circuit according to claim 15, wherein said control circuit comprises an inverter, an input terminal of which is connected to a gate of said first MOS transistor and a power source terminal of which is supplied with either a power source potential or a ground potential through said changeover switch, said inverter supplying an output to both of the gate of said first MOS transistor and a gate of said opposite channel type MOS transistor; and wherein said inverter outputs either the power source potential or the ground potential in accordance with a switched state of said changeover switch.

18. The analog switching circuit according to claim 1, wherein said first MOS transistor is a P channel MOS transistor.

19. The analog switching circuit according to claim 1, wherein a junction of said diode is opposite direction to that of a parasitic diode formed between a dispatching layer and said backgate of said first MOS transistor.

20. Semiconductor integrated circuit device including a plurality of analog switching circuits connected to a common bus line, at least one of said analog switching circuits comprising:

a switching section including a first MOS transistor having a source, a drain, a gate and a backgate; and a control section for providing an input signal supplied from one terminal of said switching section to the other terminal by on/off control, wherein said control section includes a diode, one terminal of which is connected to said backgate of said first MOS transistor;

a changeover switch connected to the other terminal of said diode for switching a connection of the other terminal of said diode to either a power source potential or a ground potential; and a control circuit connected to a connection node of said diode and said backgate of said first MOS transistor for receiving a control signal and for supplying a potential at said connection node to said gate of said first MOS transistor in accordance with a connection state of said changeover switch with said power source potential or said ground potential.

* * * * *